US008361231B2

(12) United States Patent
Kouketsu et al.

(10) Patent No.: US 8,361,231 B2
(45) Date of Patent: Jan. 29, 2013

(54) LIQUID VAPORIZATION SYSTEM

(75) Inventors: Masayuki Kouketsu, Komaki (JP); Hiroshi Itafuji, Komaki (JP)

(73) Assignee: CKD Corporation, Komaki-shi, Aichi (JP)

( * ) Notice: Subject to any disclaimer, the term of this patent is extended or adjusted under 35 U.S.C. 154(b) by 0 days.

(21) Appl. No.: 13/498,902

(22) PCT Filed: Mar. 30, 2010

(86) PCT No.: PCT/JP2010/055652

§ 371 (c)(1), (2), (4) Date: Mar. 28, 2012

(87) PCT Pub. No.: WO2011/040067

PCT Pub. Date: Apr. 7, 2011

(65) Prior Publication Data

US 2012/0180724 A1 Jul. 19, 2012

(30) Foreign Application Priority Data

Sep. 30, 2009 (JP) ................................ 2009-226691

(51) Int. Cl.
*C23C 16/00* (2006.01)
*B05C 11/00* (2006.01)

(52) U.S. Cl. ........ 118/725; 118/715; 118/722; 118/724; 118/712

(58) Field of Classification Search ........................ None
See application file for complete search history.

(56) References Cited

U.S. PATENT DOCUMENTS

| | | | | |
|---|---|---|---|---|
| 5,777,300 A * | 7/1998 | Homma et al. | ............... | 219/679 |
| 6,036,783 A * | 3/2000 | Fukunaga et al. | ............ | 118/724 |
| 6,099,653 A * | 8/2000 | Bhandari et al. | .............. | 118/726 |
| 2002/0000195 A1* | 1/2002 | Bang et al. | .................... | 118/715 |
| 2005/0006609 A1 | 1/2005 | Fukano | | |
| 2005/0223987 A1* | 10/2005 | Iwata et al. | .................. | 118/715 |
| 2006/0037539 A1* | 2/2006 | Toda et al. | .................... | 118/726 |

(Continued)

FOREIGN PATENT DOCUMENTS

| | | |
|---|---|---|
| JP | 5-156448 | 6/1993 |
| JP | 6-232035 | 8/1994 |

(Continued)

OTHER PUBLICATIONS

Sear Report dated Jul. 13, 2012 from International Application No. PCT/JP2010/055652.

*Primary Examiner* — Dah-Wei Yuan
*Assistant Examiner* — Jethro Pence
(74) *Attorney, Agent, or Firm* — Beyer Law Group LLP

(57) ABSTRACT

Provided is a liquid vaporization system capable of promoting vaporization of a liquid material while solving a problem of residual liquid material. A liquid vaporization system has a liquid vaporization apparatus having a pump and a vaporizer. The vaporizer has a case, a heater provided inside the case, a heat storage plate heated by the heater, and a mesh. The mesh is formed by interweaving wires and has an overall flat plate shape. By overlapping the mesh on an upper surface of the heat storage plate, minute irregularities are formed on the heat storage plate by the mesh. A nozzle is provided above the mesh, whereby the liquid material is dropped from the nozzle onto the heat storage plate. The liquid material spreads over the heat storage plate in a thin film and is heated and vaporized on the upper surface of the heat storage plate.

17 Claims, 20 Drawing Sheets

(b)

U.S. PATENT DOCUMENTS

| | | | | |
|---|---|---|---|---|
| 2006/0278166 | A1 * | 12/2006 | Yamoto et al. | 118/726 |
| 2007/0001326 | A1 * | 1/2007 | Toda et al. | 261/155 |
| 2007/0108060 | A1 * | 5/2007 | Park | 205/183 |
| 2009/0325389 | A1 * | 12/2009 | Takebayashi et al. | 438/758 |
| 2010/0022097 | A1 * | 1/2010 | Yamoto et al. | 438/758 |

FOREIGN PATENT DOCUMENTS

| | | |
|---|---|---|
| JP | 7-47201 | 2/1995 |
| JP | 10-337464 | 12/1998 |
| JP | 2001-295050 | 10/2001 |
| JP | 2004-115920 | 4/2004 |
| JP | 2005-57193 | 3/2005 |
| JP | 2006-352001 | 12/2006 |
| JP | 2009-38047 | 2/2009 |
| KR | 10-2005-0006072 | 1/2005 |
| KR | 10-2005-0114721 | 12/2005 |
| WO | 2004/092622 | 10/2004 |

* cited by examiner

A-A

C-C

LIQUID VAPORIZATION SYSTEM

TECHNICAL FIELD

The present invention relates to a liquid vaporization system.

BACKGROUND ART

Generally, in the production of semiconductor devices, in order to enhance adherability of a resist solution to a wafer, a liquid material for changing a hydrophilic surface to a hydrophobic surface is vaporized by a vaporizer and a surface treatment of the wafer is performed using the vaporized liquid material. As a vaporizer of this type, for example, a vaporizer is used which vaporizes a liquid material by heating the liquid material with a heater.

The liquid material vaporized by the vaporizer is normally supplied by a carrier gas to a wafer housed in a chamber. In this case, a mixture gas of the vaporized liquid material and the carrier gas is supplied to the wafer, and a problem may occur in which, for example, a fluctuation in a concentration of the liquid material in the mixture gas during treatment undermines uniformity of the treatment. Therefore, in order to perform surface treatment in a stable manner, the concentration of the liquid material in the mixture gas must kept constant during treatment.

In order to avoid such a problem, for example, Patent Document 1 discloses a configuration in which the inside of a vaporizer is filled with granules to form a porous body in the vaporizer and in which a heater for heating a liquid material is provided on the outside of the porous body. According to this configuration, the liquid material can be vaporized by introducing the liquid material into gaps in the porous body and heating the liquid material introduced into the gaps by a heater via the porous body. In this case, since a contact area between the porous body and the liquid material can be increased, vaporization of the liquid material can be promoted. As a result, it is expected that the concentration of the liquid material in the mixture gas during treatment can be kept constant.

Patent Document 1: Japanese Patent Application Laid-open No. 2001-295050

BRIEF DESCRIPTION OF THE INVENTION

However, with the technique described in Patent Document 1 above, since the inside of the vaporizer is formed by a porous body, depending on a structure of the porous body such as a porous body having minute gaps, there may be cases where the carrier gas is unable to penetrate into the porous body. In this case, since the liquid material vaporized inside the porous body cannot be delivered toward a chamber by a carrier gas, the liquid material may remain inside the porous body.

The present invention has been made in consideration of the circumstances described above, and a primary object of the present invention is to provide a liquid vaporization system capable of promoting vaporization of a liquid material while solving a problem of residual liquid material.

In order to solve the problem described above, a liquid vaporization system according to a first aspect of the invention is a liquid vaporization system comprising a vaporizer that is configured to apply heat to vaporize a liquid material. The vaporizer includes a liquid adhering surface which is formed approximately flat and to which the liquid material is adhered. The vaporizer also includes thin-film forming means that is configured to form the liquid material adhered to the liquid adhering surface into a thin film and heating means that is configured to heat the liquid adhering surface. The thin-film forming means is wetting promoting means that is configured to promote wetting of the liquid adhering surface by the liquid material, and the liquid material adhered to the liquid adhering surface is formed into a thin film by promoting the wetting of the liquid adhering surface by the liquid material. The wetting promoting means is a minute irregular section provided on the liquid adhering surface to enhance wettability of the liquid adhering surface by the liquid material. The liquid adhering surface is mounted with a mesh formed by interweaving wires in an overall flat plate shape and is provided with the irregular section in which the wires constitute protrusions and portions surrounded by the wires constitute depressions. A supply port that is configured to supply the liquid material between the liquid adhering surface and the mesh is formed on the liquid adhering surface.

According to the first aspect of the invention, the liquid material adhered to the liquid adhering surface can be formed into a thin film (can be thinly spread) by the thin-film forming means. Subsequently, by heating the liquid adhering surface with the heating means, the thin-film liquid material can be heated. In this case, since the liquid material can be heated while a contact area (in other words, a heat transfer area) between the liquid material and the liquid adhering surface is being expanded, vaporization of the liquid material can be promoted. This effect is particularly significant when the liquid material to be vaporized can easily take a droplet form.

In addition, since the liquid adhering surface on which the liquid material is heated is formed approximately flat, the vaporized liquid material can be delivered downstream (for example, toward the chamber) by the carrier gas without the vaporized liquid material remaining on the liquid adhering surface (and, consequently, in the vaporizer). Therefore, accordingly, vaporization of a liquid material can be promoted while solving a problem of residual liquid material.

Moreover, for example, the present liquid vaporization system can be used in the production of semiconductor devices when performing surface treatment of a treated object such as a wafer with a vaporized liquid material. Specifically, a system is conceivable in which a chamber for housing a treated object such as a wafer is connected to a downstream-side of a vaporizer, and surface treatment of the treated object is performed by supplying a liquid material vaporized by the vaporizer to the treated object inside the chamber. In addition, the liquid material that is vaporized in the present liquid vaporization system may conceivably include a surface preparation agent or the like that is applied to a treated object in a vaporized state such as a hydrophobizing treatment liquid.

And the liquid material adhered to the liquid adhering surface can be formed into a thin film by promoting the wetting of the liquid adhering surface by the liquid material. Consequently, an advantageous effect of the first invention described above can be achieved without having to further provide a drive unit (for example, a pressure device for compressing the liquid material) for forming the liquid material adhered to the liquid adhering surface into a thin film.

When using a liquid material having a contact angle of less than 90 degrees with the liquid adhering surface (in other words, a liquid material easily wet the liquid adhering surface), the wettability of the liquid adhering surface by the liquid material can be enhanced by the minute irregular section provided on the liquid adhering surface. Consequently, the wetting of the liquid adhering surface by the liquid material can be promoted.

Since the irregular section can be formed simply by overlapping the flat-plate shape mesh on the liquid adhering surface, an advantageous effect described above can be achieved with a simple configuration. In addition, by forming the mesh with metallic (for example, stainless steel) wires, since the mesh can be heated by the heating means via the liquid adhering surface, the liquid material formed into a thin film can be heated not only by the liquid adhering surface but also by the mesh. Consequently, vaporization of the liquid material can be further promoted.

Furthermore, in this case, by configuring the mesh so as to be detachable from the liquid adhering surface, the mesh can be replaced with a mesh with an appropriate roughness (mesh fineness) in accordance with a wettability of the liquid material to be vaporized. This is convenient when vaporizing a plurality of types of liquid materials with different wettability.

Since a supply port is formed to supply the liquid material between the liquid adhering surface and the mesh, supplied liquid material can flow through a gap between the mesh and the liquid adhering surface due to interfacial tension. Consequently, the liquid material can be smoothly supplied over a wide area of the mesh without causing a scattering (dispersion) of the liquid material. Moreover, the supply port need not necessarily be provided singularly and a plurality of supply ports may be formed instead.

A liquid vaporization system according to a second aspect of the invention is the liquid vaporization system according to the first aspect of the invention, having a positioning member that determines a relative positional relationship between the liquid adhering surface and the mesh in a stacking direction.

According to the second aspect of the invention, problems can be avoided such as the filling of gaps of the mesh by an adhesive or the like when such an adhesive is used to attach the mesh to the liquid adhering surface or the creation of solid matter due to aggregation of the liquid material in a vicinity of a fastened portion when a fastening member is used to attach the mesh to the liquid adhering surface. For example, the positioning member may be pressed against the liquid adhering surface by a net or a string fixed to an edge of the liquid adhering surface. The positioning member may also be configured so that a spacer for forming a gap between the liquid adhering surface and the mesh is partially inserted.

A liquid vaporization system according to a third aspect of the invention is the liquid vaporization system according to the second aspect of the invention, wherein the positioning member has pressing members that are configured to press the mesh against the liquid adhering surface at a plurality of positions arranged at a predetermined interval.

According to the third aspect of the invention, since the mesh is pressed against the liquid adhering surface at a plurality of positions arranged at a predetermined interval, a gap flow utilizing interfacial tension in a gap between the mesh and the liquid adhering surface can be realized at the predetermined interval with a simple configuration. Since the gap flow is formed among a plurality of pressing positions, the possibility of design can be expanded with respect to mesh roughness, a positional relationship among the plurality of pressing positions, and the like. Consequently, a design tool can be provided for realizing an appropriate gap flow in accordance with required specifications. The pressing member may be configured as a plurality of members respectively arranged at the plurality of positions where the mesh is pressed or may include a common member having a plurality of protrusions for pressing.

A liquid vaporization system according to a forth aspect of the invention is the liquid vaporization system according to the first aspect of the invention, wherein the liquid adhering surface is a surface of a heating plate that is heated by the heating means. The heating plate is formed with an orifice that connects the supply port with a rear surface opening formed on a rear surface that is opposite to the liquid adhering surface. The rear surface opening is opened and closed by a shutoff valve and is formed at a position opposing the supply port across the orifice.

According to the forth aspect of the invention, since an orifice that is opened and closed by a shutoff valve is formed on the liquid adhering surface, shutoff of the liquid material can realized in a vicinity of the liquid adhering surface. Consequently, a fluctuation in a vaporized amount attributable to the vaporization of the liquid material remaining between the shutoff valve and the liquid adhering surface can be suppressed.

A liquid vaporization system according to a fifth aspect of the invention is the liquid vaporization system according to the forth aspect of the invention, wherein a depression is formed on a rear surface of the heating plate, the rear surface opening is formed in the depression, and the shutoff valve has a valve element that is configured to close the rear surface opening.

In the fifth aspect of the invention, the rear surface opening includes a valve seat formed in a depression, the depression is formed on a rear surface of the heating plate, and the valve seat is closed by a valve element. Consequently, a length of a flow channel between the supply port and the rear surface opening can be reduced regardless of a thickness of the heating plate. In addition, by adjusting a depth of the depression, the length of the flow channel can be freely set.

A liquid vaporization system according to a sixth aspect of the invention is the liquid vaporization system according to the fifth aspect of the invention, wherein the valve element has a sealing portion that is an annular projecting portion that surrounds the rear surface opening in a state in which the rear surface opening is closed.

According to the sixth aspect of the invention, since the valve element has a sealing portion, a sealing property can be enhanced while suppressing retention of bubbles attributable to bulging of the valve seat.

A liquid vaporization system according to a seventh aspect of the invention is the liquid vaporization system according to the fifth aspect of the invention, wherein the rear surface opening has a valve seat formed in the depression. As shown, the rear surface opening may be configured so as to have a valve seat formed in the depression.

A liquid vaporization system according to an eighth aspect of the invention is the liquid vaporization system according to the fifth aspect of the invention, wherein the rear surface opening has a flat surface that opposes the valve element in an annular region surrounding the rear surface opening. As shown, instead of a configuration in which surface pressure is increased by providing a valve seat or a projecting portion, a flat surface opposing the valve element may be provided instead. This is because back pressure is not applied during shutoff in the present aspect of the invention. However, favorably, a surface roughness of the annular region surrounding the rear surface opening is lowered in order to enhance a sealing property.

A liquid vaporization system according to a ninth aspect of the invention is the liquid vaporization system according to the fifth aspect of the inventions, wherein the valve element has a diaphragm that is configured to open and close the rear surface opening.

According to the ninth aspect of the invention, since the diaphragm does not have a slide portion on a side of a flow channel, the creation of solid matter attributable to an accumulation of the liquid material at the sliding portion can be prevented. Consequently, by suppressing the creation of solid matter, quality degradation of a process target attributable to contamination of nitrogen gas by the solid matter can be prevented.

A liquid vaporization system according to a tenth aspect of the invention is the liquid vaporization system according to the first aspect of the invention, wherein the liquid adhering surface is formed as a surface of a heating plate that is heated by the heating means. And the heating plate is provided with a temperature sensor that is configured to measure a temperature of the liquid adhering surface.

According to the tenth aspect of the invention, a state of vaporization on the liquid adhering surface can be observed as a temperature variation of the heating plate attributable to vaporization heat. The temperature sensor can be utilized for various purposes including monitoring a vaporization process and detecting a failure.

A liquid vaporization system according to an eleventh aspect of the invention is the liquid vaporization system according to the first aspect of the invention, further having a pump that is configured to supply the liquid material to the vaporizer. The pump includes, for example, a first diaphragm driving unit, a second diaphragm driving unit, and a joining section that joins the first diaphragm driving unit and the second diaphragm driving unit in a direction in which the first diaphragm driving unit and the second diaphragm driving unit oppose each other. The joining section has a pump chamber to which a suction passage that is configured to suction the liquid material and a discharge passage that is configured to discharge the liquid material are connected. The first diaphragm driving unit has a first diaphragm that constitutes a part of the pump chamber and the second diaphragm driving unit has a second diaphragm that constitutes a part of the pump chamber. The first diaphragm and the second diaphragm form surfaces that oppose each other in the pump chamber. The first diaphragm driving unit has a first displacement limiting unit that limits a first displacement by which the first diaphragm is mechanically displaceable and that enables adjustment of the first displacement. And the second diaphragm driving unit has a second displacement limiting unit that limits a second displacement by which the second diaphragm is mechanically displaceable and that enables adjustment of the second displacement.

According to the eleventh aspect of the invention, since displacements by which the first diaphragm and the second diaphragm are mechanically displaceable can be adjustably limited, by activating the first diaphragm and the second diaphragm to the full extent of their displacement limits and by operating the number of activations per unit time, a supply rate of the liquid material can be easily and accurately controlled. The eleventh aspect of the invention also has an advantage in that a sensor for measuring a displacement of a diaphragm can be omitted.

A liquid vaporization system according to a twelfth aspect of the invention is the liquid vaporization system according to the eleventh aspect of the invention, wherein the first displacement limiting unit is configured to adjust the first displacement by performing a first rotation relative to the pump with a displacement direction of the first diaphragm as an axis. The second displacement limiting unit is configured to adjust the second displacement by performing a second rotation relative to the pump with a displacement direction of the second diaphragm as an axis. And the pump is provided with a measuring unit that is configured to indicate a value related to a discharge amount measured in accordance with an angle of the first rotation and an angle of the second rotation.

According to the twelfth aspect of the invention, a discharge amount (an amount per stroke) can be accurately and easily set without having to actually measure the discharge amount. Note that "a value related to a discharge amount" is used in a broad sense so as to include values related to a discharge amount such as a feed of the first displacement limiting unit or the second displacement limiting unit attributable to the first rotation or the second rotation.

A liquid vaporization system according to a thirteenth aspect of the invention is the liquid vaporization system according to the first aspect of the invention, wherein the irregular section has a large number of depressions and a large number of protrusions. And, preferably, the respective depressions and the respective protrusions are alternately arranged along two different directions that are both parallel to the liquid adhering surface.

According to the thirteenth aspect of the invention, since the depressions and the protrusions are alternately arranged along two different directions that are both parallel to the liquid adhering surface, a wettability (in other words, ease of wetting) of the liquid adhering surface by a liquid material can be enhanced in the two directions. In other words, since wetting of the liquid adhering surface by the liquid material can be promoted in the two directions, a contact area between the liquid material and the liquid adhering surface can be further increased. Consequently, vaporization of the liquid material can be further promoted.

A liquid vaporization system according to a fourteenth aspect of the invention is the liquid vaporization system according to the first aspect of the invention, wherein the vaporizer has a pair of the liquid adhering surfaces opposing each other with a predetermined gap therebetween. And the wetting promoting means promotes wetting of the respective liquid adhering surfaces by the liquid material in the gap by capillary action.

According to the fourteenth aspect of the invention, when vaporizing a liquid material having a contact angle of less than 90 degrees with the liquid adhering surface (in other words, a liquid material easily wetting the liquid adhering surface), by supplying the liquid material into the gap between the opposing liquid adhering surfaces, the liquid material can be adhered to the respective liquid adhering surfaces in a thin film state due to capillary action (in other words, using surface tension). In this case, vaporization of the liquid material can be further promoted by heating the pair of liquid adhering surfaces with the heating means.

A liquid vaporization system according to a fifteenth aspect of the invention is the liquid vaporization system according to the first aspect of the invention, having a pump that is configured to supply the liquid material to the vaporizer via a supply passage. The liquid vaporization system also has supply adjusting means that is configured to adjust a supply of the liquid material to the vaporizer by the pump.

According to the fifteenth aspect of the invention, the supply of a liquid material supplied to the vaporizer by the pump can be adjusted by the supply adjusting means. Therefore, for example, in a system in which a liquid material vaporized by a vaporizer is supplied to a chamber housing a wafer, by adjusting the supply of the liquid material to the vaporizer by the pump, the supply of the liquid material vaporized by the vaporizer to the chamber can be adjusted. In other words, in this case, a predetermined amount of vaporized liquid material can be supplied to the chamber by supplying the liquid material in an amount corresponding to the predetermined amount from a liquid tank storing the liquid material to the vaporizer by a pump. Therefore, the liquid material in the liquid tank can be stored in a fresh state without vaporizing the liquid material.

Furthermore, in this case, an on-off valve that opens and closes a supply passage may be provided in the supply passage, wherein the on-off valve is closed when not supplying the liquid material to the vaporizer by the pump. Consequently, since the liquid material on an upstream side of the on-off valve can be prevented from being exposed to air, the liquid material in the supply passage (in the supply passage on an upstream side of the on-off valve) immediately before being supplied to the vaporizer can also be kept in a fresh state.

A liquid vaporization system according to a sixteenth aspect of the invention is the liquid vaporization system according to the fifteenth aspect of the invention, having suck back control means that is configured to control the pump to suction the liquid material remaining in the supply passage after the pump supplies the liquid material to the vaporizer via the supply passage.

According to the sixteenth aspect of the invention, even if a part of the liquid material remains in the supply passage after the liquid material is supplied to the vaporizer via the supply passage by the pump, the remaining liquid material can be suctioned by the pump (in other words, the remaining liquid material can be sucked back). Consequently, due to vaporization of the liquid material remaining in the supply passage (for example, at an end of the passage on a side of the vaporizer), an inconvenience such as a fluctuation of a vaporization amount of the liquid material can be avoided.

A liquid vaporization system according to a seventeenth aspect of the invention is the liquid vaporization system according to the fifteenth aspect of the invention, having a unitized liquid vaporization apparatus including the pump, the vaporizer, and the supply passage.

According to the seventeenth aspect of the invention, a unitized liquid vaporization apparatus includes a pump and a vaporizer. Therefore, for example, in a system in which a liquid material vaporized by a vaporizer is supplied to a chamber housing a wafer, the liquid vaporization apparatus provided on an upstream side of the chamber can be configured in a compact manner and, as a result, the apparatus can be arranged in a vicinity of the chamber. In this case, since a length of a pipe that connects the liquid vaporization apparatus (vaporizer) and the chamber can be relatively shortened, re-liquefaction of the liquid material vaporized by the vaporizer can be suppressed in the pipe before being supplied to the chamber.

DETAILED DESCRIPTION OF EMBODIMENTS OF THE INVENTION (First Embodiment)

Hereinafter, a first embodiment that embodies the present invention will be described with reference to the drawings. The present embodiment embodies a chemical supply system used in a semiconductor device production line or the like. First, a basic configuration of the present system will be described with reference to a schematic view shown in FIG. 1.

The present embodiment uses a liquid vaporization system to vaporize a hydrophobizing treatment liquid as a liquid material. In the present system, vaporized liquid material is applied to a surface of a semiconductor wafer (hereinafter, a wafer for short) in order to enhance adhesion of a resist solution to the wafer.

Figure 1:
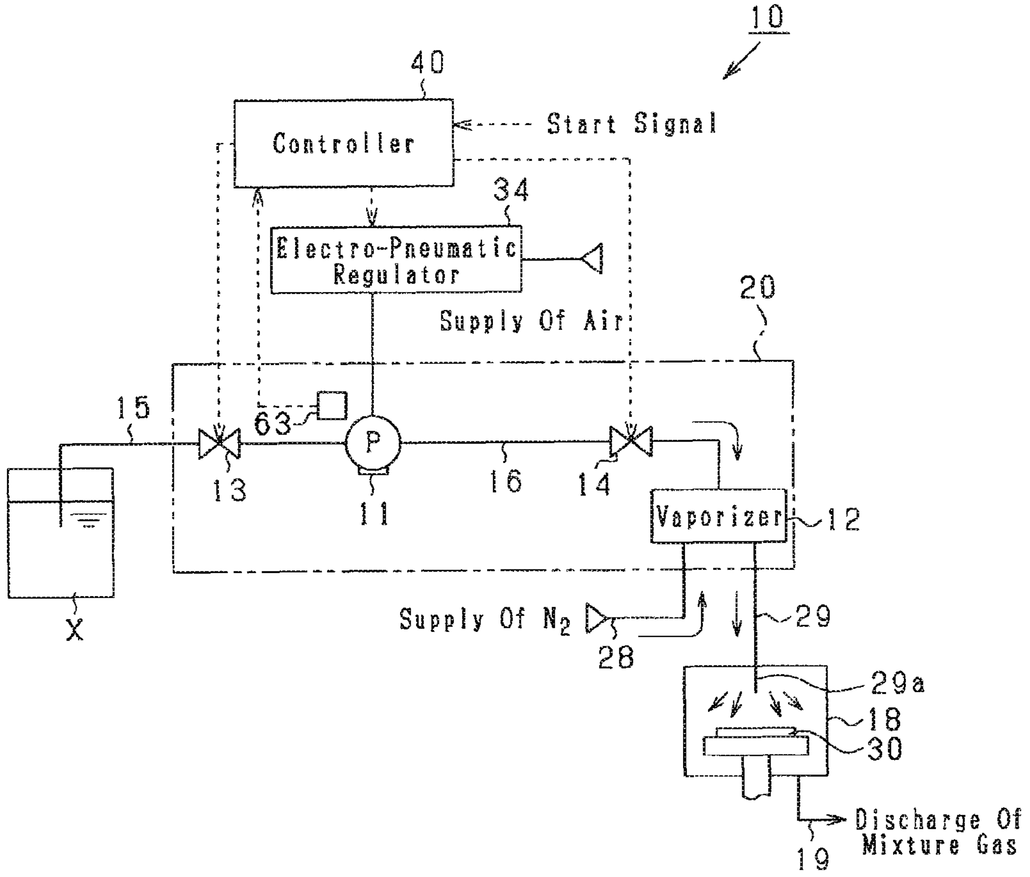
FIG. 1 is a circuit diagram showing an overall configuration of a liquid vaporization system according to a first embodiment.

As shown in FIG. 1, a present liquid vaporization system 10 includes a liquid vaporization apparatus 20 for vaporizing liquid material. The liquid vaporization apparatus 20 has a pump 11, a vaporizer 12, a suction valve 13, and a discharge valve 14. The pump 11 is a diaphragm pump for suctioning and discharging a liquid material. The pump 11 is connected to an electro-pneumatic regulator 34 that adjusts pressure of air supplied to the pump 11, and performs suction and discharge of the liquid material by adjusting air pressure with the electro-pneumatic regulator 34.

The pump 11 suctions a liquid material stored in a liquid tank X via a suction passage 15 and supplies (discharges) the suctioned liquid material to the vaporizer 12 via a discharge passage 16. The suction valve 13 that permits or prohibits circulation of the liquid material is provided in the suction passage 15, and the discharge valve 14 that similarly permits or prohibits circulation of the liquid material is provided in the discharge passage 16. The respective valves 13 and 14 are opened and closed by electrical operations.

The vaporizer 12 is for vaporizing the liquid material and has a heater 22 (to be described later) and so on. The liquid material supplied to the vaporizer 12 by the pump 11 is vaporized at the vaporizer 12. A gas inlet pipe 28 and a gas discharge pipe 29 are connected to the vaporizer 12. Nitrogen gas as a carrier gas is supplied to the vaporizer 12 from a nitrogen gas source via the gas inlet pipe 28, and the supplied nitrogen gas is mixed with the liquid material vaporized by the vaporizer 12. Subsequently, the mixture gas is discharged from the vaporizer 12 through the gas discharge pipe 29.

The present liquid vaporization system 10 has a chamber 18 that houses a wafer 30. The chamber 18 is connected to the vaporizer 12 via the gas discharge pipe 29, and the mixture gas discharged from the vaporizer 12 is supplied to the chamber 18 via the gas discharge pipe 29. Specifically, a downstream-side (a side of the chamber 18) end of the gas discharge pipe 29 constitutes a discharge nozzle 29*a*, and the mixture gas is discharged towards the wafer 30 from the discharge nozzle 29*a*. In addition, an exhaust duct 19 for discharging the mixture gas in the chamber 18 is connected to the chamber 18. Used mixture gas in the chamber 18 is discharged to the outside via the exhaust duct 19 by being suctioned by an exhaust blower or the like.

The present liquid vaporization system 10 further has a controller 40 as control means. The controller 40 controls suction and discharge operations of the pump 11 by controlling driving of the electro-pneumatic regulator 34 and also controls operations of the respective valves 13 and 14. Details of an electrical configuration of the present system 10 centered around the controller 40 will be described later.

Figure 2:
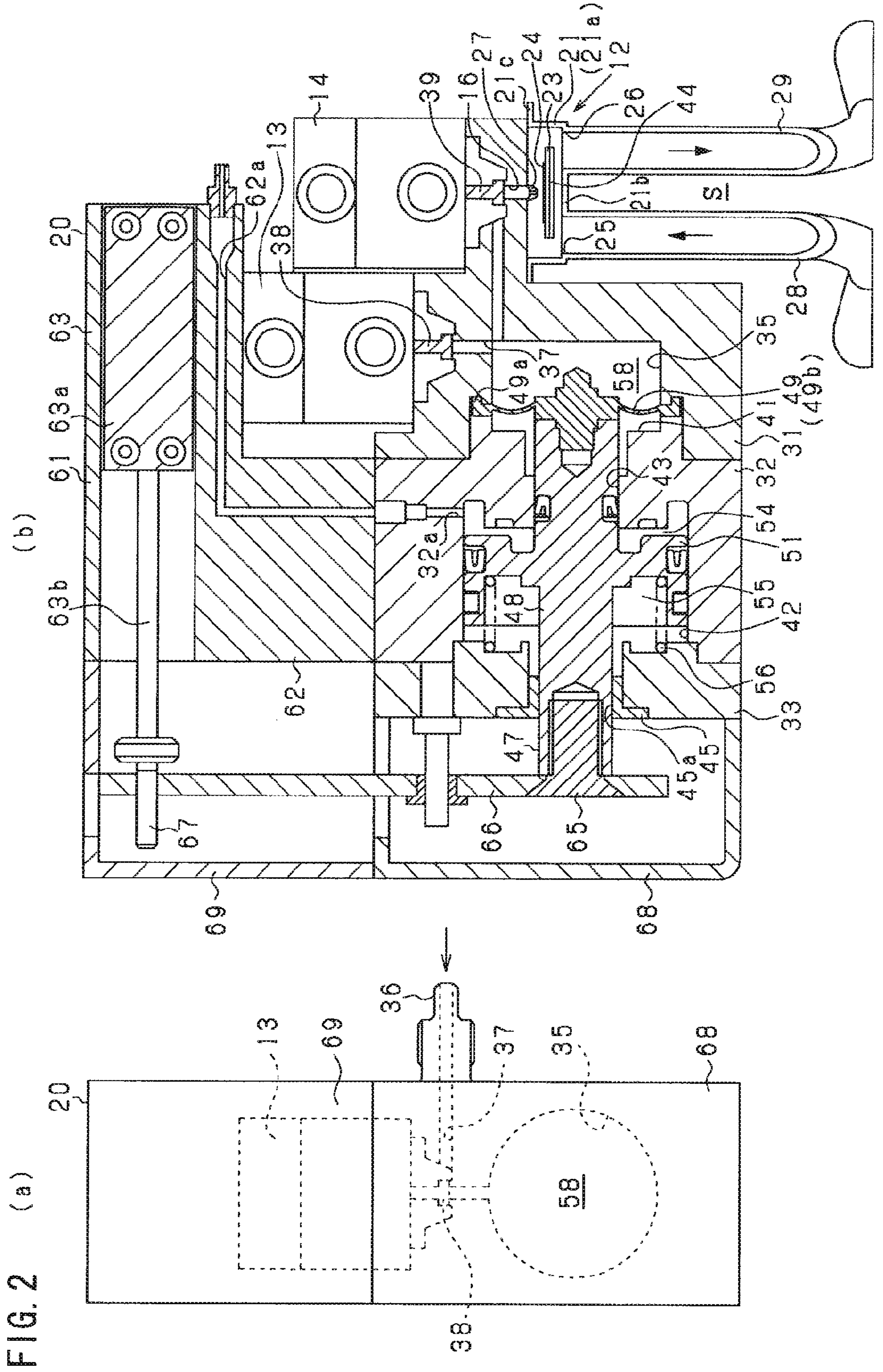
FIG. 2(*a*) is a side view of a liquid vaporization apparatus, and FIG. 2(*b*) is a longitudinal sectional view showing a configuration of a liquid vaporization apparatus.

Next, a configuration of the liquid vaporization apparatus 20 will be described with reference to FIG. 2. In FIG. 2, FIG. 2(*a*) is a side view of the liquid vaporization apparatus 20 and FIG. 2(*b*) is a longitudinal sectional view showing a configuration of the liquid vaporization apparatus 20.

As shown in FIG. 2, the liquid vaporization apparatus 20 has a body 31, a cylinder main body 32, and a cover 33. The respective members 31 to 33 are integrally assembled by a fastening member such as a bolt in a state in which the respective members 31 to 33 are stacked in the order described above in an approximately horizontal direction (a left-right direction in FIG. 2(*b*)). The body 31 is made of a fluororesin or the like, and the cylinder main body 32 and the cover 33 are made of a polypropylene resin or the like. The body 31, the cylinder main body 32, and the cover 33 have a hollow portion extending in a stacking direction thereof, and a valve member 47 is reciprocatably provided in the hollow portion.

In the body 31, a columnar depression 35 is formed which is approximately columnar and which opens to a side of the cylinder main body 32, and two passages 16 and 37 which communicate with the columnar depression 35 are formed in the body 31. Among the two passages 16 and 37, one passage 37 leads to a suction port 36 for suctioning the liquid material and the other passage 16 leads to the vaporizer 12. A suction pipe (not shown) that leads to the liquid tank X is connected to the suction port 36. The suction passage 15 shown in FIG. 1 is constituted by the suction pipe and the passage 37.

The suction valve 13 and the discharge valve 14 are provided side by side with their respective positions slightly vertically displaced above the body 31. The suction valve 13 has a valve element 38 that opens and closes the suction passage 37, and permits or prohibits circulation of the liquid material by moving the valve element 38 in an opening or closing direction. On the other hand, the discharge valve 14 has a valve element 39 that opens and closes the discharge passage 16, and permits or prohibits circulation of the liquid material by moving the valve element 39 in an opening or closing direction.

A vaporizer space S is provided on a side opposite to the cylinder main body 32 across the body 31. The vaporizer has an approximately rectangular parallelepiped shape and is continuously opened on side and on a lower side of the body 31. The vaporizer space S is used for installing the vaporizer 12.

A disk-like depression 41 which has an approximately disk-like shape and which opens to the body 31 is formed on the cylinder main body 32. Together with the columnar depression 35 of the body 31, the disk-like depression 41 forms a continuous columnar space. In addition, a cylinder portion 42 which is approximately columnar and which opens to the cover 33 and a valve supporting hole 43 are formed on the cylinder main body 32. The cylinder portion 42 and the disk-like depression 41 communicate with each other through the valve supporting hole 43. The valve supporting hole 43 is formed with a diameter which is coaxial with the cylinder portion 42 (having a same central position) and which is smaller than a cylinder diameter.

A guide 45 having a valve supporting hole 45*a* is assembled onto the cover 33. The valve supporting hole 45*a* is a through hole that is coaxial with the valve supporting hole 43 of the cylinder main body 32.

The valve member 47 is configured by integrating a rod 48 and a diaphragm valve element 49, wherein the diaphragm valve element 49 is joined to one end of the rod 48. A piston portion 51 which has an approximately disk-like shape and which has an outside diameter that is the same as an inner diameter of the cylinder portion 42 is formed on the rod 48. An outer circumferential part of the piston portion 51 is in contact with an inner surface of the cylinder portion 42, and the piston portion 51 is slidably housed in the cylinder portion 42. The rod 48 is inserted into the valve supporting hole 45*a* of the guide 45 provided on the cover 33 and is also inserted into the valve supporting hole 43 provided on the cylinder main body 32.

The cylinder portion 42 of the cylinder main body 32 is divided into two spaces by the piston portion 51 of the rod 48. Among the two spaces, a space closer to the body 31 than to the piston portion 51 constitutes a pressure control chamber 54. Operating air is introduced into the pressure control chamber 54 from the outside via an air inlet passage 32*a* formed in the cylinder main body 32. Air pressure inside the pressure control chamber 54 is adjusted by the operating air. On the other hand, a space closer to the cover 33 than to the piston portion 51 among the two spaces constitutes a spring chamber 55 in which a spring 56 with a spiral coil shape is arranged. Therefore, the air pressure in the pressure control chamber 54 and a biasing force of the spring 56 act on the rod 48 in opposite directions and a position of the rod 48 is adjusted by a balance of the two forces.

The diaphragm valve element 49 is joined to an end of the rod 48 on a side of the body 31 and is formed by, for example, a fluororesin. The diaphragm valve element 49 has an outer edge portion 49*a* sandwiched between the body 31 and the cylinder main body 32, and a diaphragm membrane 49*b* that divides the continuous space constituted by the columnar depression 35 of the body 31 and the disk-like depression 41 of the cylinder main body 32 into two spaces. Among the two divided spaces, a space closer to the body 31 than to the diaphragm membrane 49*b* constitutes a pump chamber 58. The suction passage 37 and the discharge passage 16 are communicated with the pump chamber 58.

In the configuration described above, when the valve member 47 moves in an axial direction, the diaphragm membrane 49*b* of the diaphragm valve element 49 is accordingly displaced in the same direction and, as a result, a capacity of the pump chamber 58 varies. Consequently, the liquid material can be suctioned into the pump chamber 58 via the suction passage 37 and the liquid material in the pump chamber 58 can be discharged via the discharge passage 16. In other words, in the present liquid vaporization apparatus 20, the diaphragm pump 11 is configured in this manner.

A position transducer 61 for detecting a displacement of the valve member 47 is provided above the body 31 and the cylinder main body 32. The position transducer 61 has a case 62 fixed to an upper surface of the cylinder main body 32 and a position sensor 63 housed in the case 62. The position sensor 63 has a sensor main body 63*a* and a movable rod 63*b* that is movable in a projecting direction or an immersing direction with respect to the sensor main body 63*a*. The movable rod 63*b* is biased in a projecting direction with respect to the sensor main body 63*a* by biasing means (not shown) such as a spring, and a position of the movable rod 63*b* in an axial direction is changed when a end portion is pressed.

Specifically, with a configuration of the valve member 47 with respect to displacement detection, an end of the valve member 47 on an opposite side to the diaphragm valve element 49 projects from the cover 33, and an arm 66 is joined to the projecting portion by a screw 65. The arm 66 is provided so as to extend in a direction perpendicular to an axial direction of the valve member 47, and a position adjusting screw 67 is provided on a end of the arm 66 on a side opposite to a connection side with the valve member 47.

Respective ends of the position adjusting screw 67 and the movable rod 63*b* of the position sensor 63 abut each other, and when the valve member 47 moves, the arm 66 accordingly moves in the same direction while a position of the movable rod 63*b* in an axial direction changes. Consequently, a displacement of the valve member 47 can be detected by the position sensor 63.

An air passage 62*a* is formed in the case 62. The air passage 62*a* is communicated with the air inlet passage 32*a* of the cylinder main body 32. Operating air is supplied to the air passage 62*a* from an external apparatus such as an electro-pneumatic regulator (not shown), and the operating air is supplied to the pressure control chamber 54 via the air passage 62*a* and the air inlet passage 32*a*. The supplying of the operating air adjusts the air pressure in the pressure control chamber 54 and controls the displacement of the valve member 47. In addition, controlling the displacement of the valve member 47 controls a capacity of the pump chamber 58 and, as a result, controls suction and discharge of the liquid material by the pump 11.

Moreover, the present apparatus 20 is provided with covers 68 and 69 for covering a component (the arm 66 or the like) that joins the position transducer 61 and the valve member 47 with each other, thereby preventing the joining component from being exposed.

Figure 3:
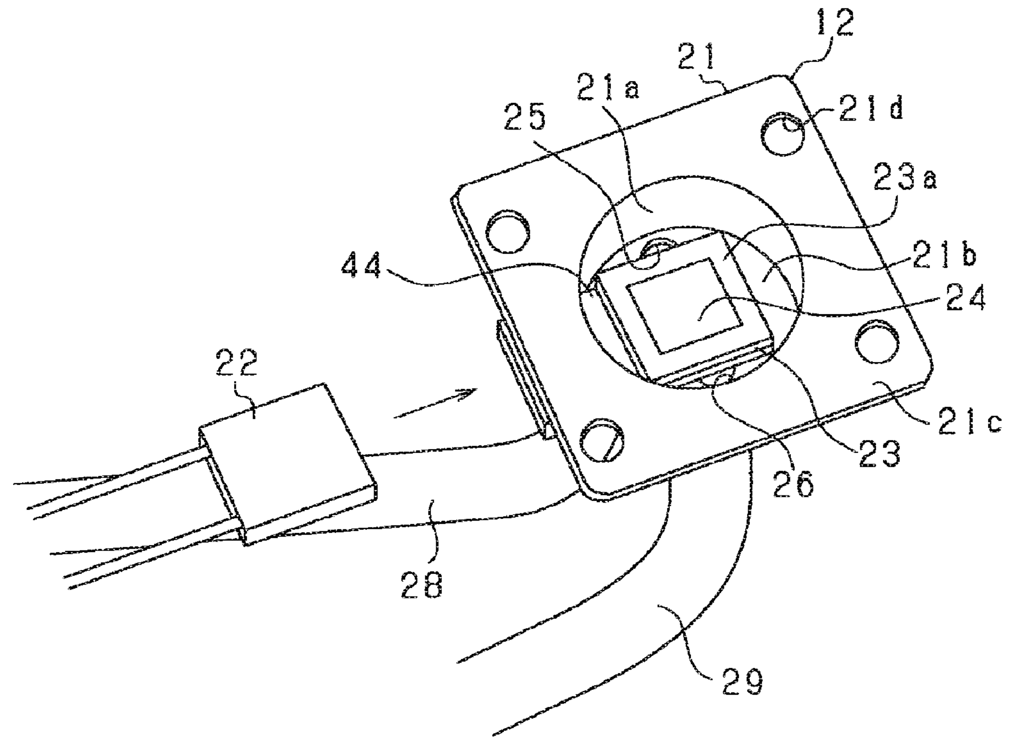
FIG. 3 is a perspective view showing a configuration of a vaporizer.
Figure 4:
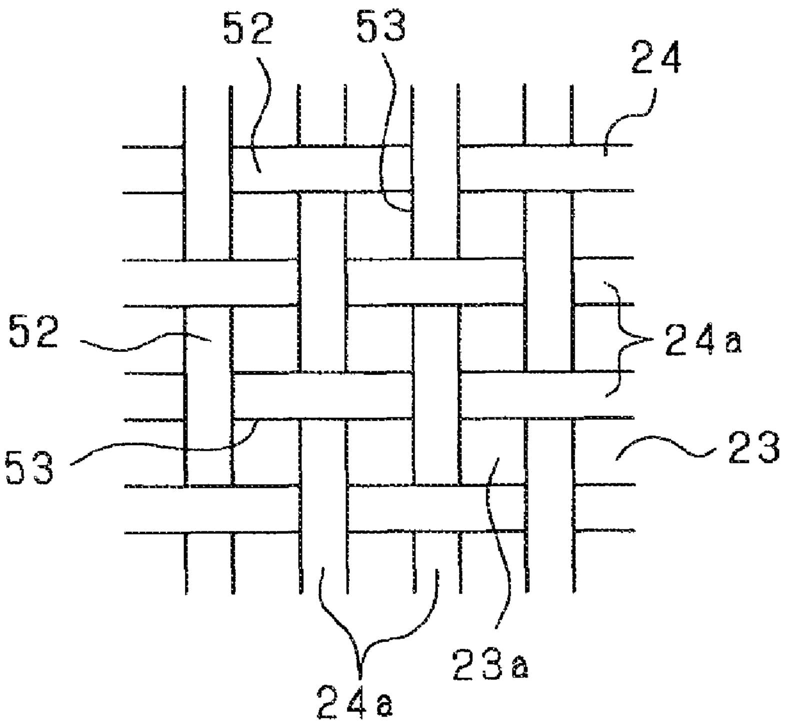
FIG. 4 is a plan view showing an enlargement of a mesh on a heat storage plate.

The vaporizer 12 is provided in the vaporizer space S formed in the body 31. The configuration of the vaporizer 12 is a feature of the present embodiment and will be described in detail below with reference to FIGS. 3 and 4 in addition to FIG. 2. FIG. 3 is a perspective view showing a configuration of the vaporizer 12 and FIG. 4 is a plan view showing an enlargement of a mesh on a heat storage plate.

As shown in FIGS. 2 and 3, the vaporizer 12 has a case 21 that forms a vaporization chamber, a heater 22 as heating means provided inside the case 21, a heat storage plate 23 that is heated by the heater 22, and a mesh 24 provided on the heat storage plate 23. The case 21 is formed by stainless steel that is highly resistant to corrosion in a cylindrical shape, and has a cylinder portion 21*a*, a bottom plate portion 21*b* provided at a lower end of the cylinder portion 21*a*, and a flange portion 21*c* provided at an upper end of the cylinder portion 21*a*. The flange portion 21*c* of the case 21 abuts an upper surface of the vaporizer space S in the body 31. Through hole portions 21*d* are provided at four corners of the flange portion 21*c*, and the flange portion 21*c* is fixed to the body 31 by bolts inserted into the through hole portions 21*d*. The heat storage plate is also referred to as a heating plate.

A gas inlet 25 and a gas outlet 26 are formed on the bottom plate portion 21*b* of the case 21. The gas inlet 25 and the gas outlet 26 are arranged on both sides of the heater 22 in plan view. The gas inlet pipe 28 is connected to the gas inlet 25 and the gas discharge pipe 29 is connected to the gas outlet 26. The respective pipes 28 and 29 are constituted by, for example, stainless steel pipes.

A heater housing portion 44 for housing the heater 22 is provided in the case 21. The heater housing portion 44 is formed by, for example, aluminum which has superior thermal conductivity. The heater housing portion 44 is provided penetrating the cylinder portion 21*a* both inside and outside the case 21 while securing airtightness of the vaporizer 12. Specifically, the heater housing portion 44 has an upper plate portion and a lower plate portion which are formed in a horizontal plate shape and which oppose each other and ends which connect both ends of the respective plate portions in a width direction over a short distance, and has an overall thin square tube shape. Moreover, the heater housing portion 44 is provided separated above the bottom plate portion 21*b* of the case 21.

The heater 22 is constituted by a ceramic heater formed in a rectangular flat plate shape. The heater 22 is housed in the heater housing portion 44 and is in close contact with the respective plate portions of the heater housing portion 44 in the housed state. By being housed in the heater housing portion 44, the heater 22 is arranged inside the case 21 while being separated from the vaporization chamber. In other words, this configuration prevents the heater 22 from being exposed to the liquid material vaporized in the vaporization chamber.

The heat storage plate 23 is made of a rectangular plate material formed by silicon carbide which has superior thermal conductivity. The heat storage plate 23 is fixed to the heater housing portion 44 by a screw or the like in a state where the heat storage plate 23 overlaps an upper surface of the heater housing portion 44. An upper surface 23*a* of the heat storage plate 23 constitutes a liquid adhering surface to which the liquid material is adhered. As the heat storage plate 23 is heated by the heater 22 via the heater housing portion 44, the entire upper surface 23*a* is maintained at a constant temperature. Moreover, the liquid material that is vaporized in the present embodiment has a contact angle of less than 90 degrees with the upper surface 23*a* of the heat storage plate 23.

As shown in FIG. 4, the mesh 24 is formed by interweaving a plurality of stainless-steel wires 24*a* arranged vertically and horizontally, and has an overall flat plate shape. In the present embodiment, a mesh with a wire diameter (a diameter of the wires 24*a*) of 0.1 mm and wire spacing of 0.15 mm (a so-called 100 mesh) is used as the mesh 24. The mesh 24 is overlapped on the upper surface 23*a* of the heat storage plate 23 and is detachably fixed to the heat storage plate 23 by a screw or the like in the overlapped state.

In addition, by overlapping the mesh 24 on the upper surface 23*a* of the heat storage plate 23, minute irregularities are provided on the heat storage plate 23 by the mesh 24. Specifically, irregularities in which the wires 24*a* of the mesh 24 constitute protrusions 52 and inner areas surrounded by the wires 24*a* constitute depressions 53 are provided on the heat storage plate 23, wherein the protrusions 52 and the depressions 53 are alternately arranged in two directions that are perpendicular to each other. Moreover, in the present embodiment, the depressions 53 have a square shape in plan view.

A nozzle 27 for discharging (dropping) the liquid material onto the heat storage plate 23 (the mesh 24) is provided above the mesh 24. Specifically, the nozzle 27 is arranged at a position above an approximately central part of the mesh 24. The nozzle 27 is connected to an end of the discharge passage 16 on a side of the vaporizer 12 and is fixed to, for example, an upper surface of the vaporizer space S in the body 31.

This concludes the description of the configuration of the liquid vaporization apparatus 20.

Returning now to the description of FIG. 1, the controller 40 is an electronic control device mainly having a microcomputer consisting of a CPU, various memories, and so on. In the controller 40, an amount of the liquid material to be applied to the wafer 30 during surface treatment or, in other words, an amount of the liquid material supplied to the vaporizer 12 by the pump 11 (hereinafter referred to as a set supply) is inputted from a management computer or the like that supervises the present system and is stored (set) in a memory (not shown). In addition, displacements of the valve member 47 detected by the position sensor 63 are sequentially inputted to the controller 40. Based on the respective inputs, the controller 40 controls driving of the electro-pneumatic regulator 34 and operations of the respective valves 13 and 14 so that the liquid material corresponding to the set supply is supplied to the vaporizer 12 by the pump 11.

Moreover, in the present embodiment, a configuration is adopted in which the liquid material is supplied to the vaporizer 12 by one suction operation and one discharge operation (in other words, one operation cycle) performed by the pump 11. In other words, a configuration is adopted in which just an amount of the liquid material to be supplied to the vaporizer 12 is suctioned from the liquid tank X by the pump 11 and supplied to the vaporizer 12.

Next, an operation when vaporizing the liquid material with the present liquid vaporization system 10 will be described. In this case, a hexamethyldisilazane solution (HMDS solution) is assumed as a hydrophobizing treatment liquid that is the liquid material.

First, contents of control executed by the controller 40 when vaporizing the liquid material will be described.

When a start signal is inputted from the management computer and so on to start supplying the liquid material to the vaporizer 12, the controller 40 opens the suction valve 13 and closes the discharge valve 14. The controller 40 then drives the electro-pneumatic regulator 34 based on a set supply stored in a memory and on a detection signal from the position sensor 63 and causes a suction operation of the pump 11. Accordingly, the liquid material is suctioned from the liquid tank X via the suction passage 15 into the pump chamber 58.

Subsequently, the controller 40 opens the discharge valve 14 and closes the suction valve 13. The controller 40 then drives the electro-pneumatic regulator 34 based on a set supply stored in a memory and on a detection signal from the position sensor 63 and causes a discharge operation of the pump 11. Accordingly, the liquid material corresponding to the set supply is supplied to the nozzle 27 from the pump chamber 58 through the discharge passage 16, and dropped from the nozzle 27 onto the heat storage plate 23 (the mesh 24) in the vaporizer 12. In this case, the set supply of the liquid material is set to 90 μL.

Subsequently, the controller 40 drives the electro-pneumatic regulator 34 while maintaining the open and closed states of the respective valves 13 and 14 and causes a suction operation of the pump 11. Accordingly, when liquid material remains in the discharge passage 16, the remaining liquid material is suctioned toward the pump chamber 58. More specifically, the remaining liquid material is suctioned to at least an upstream side of the discharge valve 14. Consequently, even when a part of the liquid material remains at an end of the discharge passage 16 on the side of the nozzle 27 or the like after the liquid material is dropped, inconveniences such as a fluctuation of a vaporization amount of the liquid material caused by vaporization of the remaining liquid material can be avoided. Moreover, after a suction operation is performed by the pump 11, the controller 40 closes the discharge valve 14.

Next, vaporization of the liquid material dropped onto the heat storage plate 23 (the mesh 24) will be described.

The liquid material dropped onto the heat storage plate 23 from the nozzle 27 rapidly spreads across the upper surface 23*a* of the heat storage plate 23 in an approximately square shape in plan view from the dropped location as a center. Specifically, the liquid material spreads in a square shape having two sides which are perpendicular to each other and which are respectively parallel to the vertical and horizontal wires 24*a* of the mesh 24.

Consequently, the liquid material is applied to the upper surface 23*a* of the heat storage plate 23 in a thin film having an approximately square shape in plan view. Specifically, in this thin film state, the liquid material has penetrated into the depressions 53 provided on the heat storage plate 23 by the mesh 24, and the liquid material in the depressions 53 have adhered to the upper surface 23*a* of the heat storage plate 23.

The liquid material spread in a thin film is in contact with both the upper surface 23*a* of the heat storage plate 23 heated by the heater 22 and the mesh 24 that is similarly heated by the heater 22 via the upper surface 23*a* of the heat storage plate 23. Therefore, in this case, the liquid material is heated by both parts 23*a* and 24 and is vaporized rapidly. Moreover, after the liquid material vaporizes, the inside of the depressions 53 which have been penetrated by the liquid material becomes empty.

According to the configuration of the present embodiment described in detail above, the following superior advantageous effects may be achieved.

By providing irregularities on the heat storage plate 23 by overlapping the mesh 24 onto the upper surface 23*a* of the heat storage plate 23 and promoting wetting of the upper surface 23*a* of the heat storage plate 23 by the liquid material with the irregularities, the liquid material adhered to the upper surface 23*a* of the heat storage plate 23 is formed into a thin film. In addition, by heating the upper surface 23*a* of the heat storage plate 23 with the heater 22, the liquid material formed into a thin film is heated.

In this case, since the liquid material can be heated while expanding a contact area (in other words, a heat transfer area) between the liquid material and the upper surface 23*a* of the heat storage plate 23, vaporization of the liquid material can be promoted. Furthermore, since the upper surface 23*a* of the heat storage plate 23 for heating the liquid material is formed approximately flat, vaporized liquid material can be delivered to the chamber 18 by nitrogen gas without any vaporized liquid material remaining on the upper surface 23*a* of the heat storage plate 23. Therefore, vaporization of a liquid material can be promoted while solving a problem of residual liquid material.

In addition, when the amount of the liquid material that is vaporized is minute (for example, 90 μL) as is the case of the present embodiment, with a configuration in which the liquid material is adhered onto the heat storage plate 23 without irregularities, there may be a case where the liquid material takes a shape that bulges from the upper surface 23*a* on the heat storage plate 23 and prevents securing of a large contact area between the liquid material and the upper surface 23*a* of the heat storage plate 23.

Therefore, in such a case, it is conceivably difficult to rapidly vaporize the liquid material. In contrast, with the configuration described above in which irregularities are provided on the heat storage plate 23, since the liquid material can be formed into a thin film on the heat storage plate 23 even when the amount of the liquid material is minute, a contact area between the liquid material and the upper surface 23*a* of the heat storage plate 23 can be increased and, as a result, the liquid material can be vaporized rapidly.

By promoting wetting of the upper surface 23*a* of the heat storage plate 23 by the liquid material, the liquid material adhered to the upper surface 23*a* of the heat storage plate 23 is formed into a thin film. As a result, the advantageous effect described above can be achieved without having to provide a separate drive unit (for example, a pressure device for compressing the liquid material) for forming the liquid material adhered to the upper surface 23*a* of the heat storage plate 23 into a thin film.

By adopting a configuration in which irregularities are provided on the heat storage plate 23 by overlapping the mesh 24 onto the upper surface 23*a* of the heat storage plate 23, the advantageous effect described above can be achieved with a simple configuration. Furthermore, since the mesh is detachably fixed to the heat storage plate 23, the mesh 24 can be replaced with a mesh 24 with an appropriate roughness (mesh fineness) in accordance with a wettability of the liquid material to be vaporized. This is convenient when vaporizing a plurality of types of liquid materials with different wettability.

Since the mesh 24 is formed using stainless steel wires having superior thermal conductivity, the mesh 24 can be heated by the heater 22 via the upper surface 23*a* of the heat storage plate 23. In this case, since the liquid material can be heated not only on the upper surface 23*a* of the heat storage plate 23 but also by the mesh 24, vaporization of the liquid material can be further promoted.

By providing the flat plate shape mesh 24 formed by interweaving a plurality of wires 24*a* arranged vertically and horizontally on the upper surface 23*a* of the heat storage plate 23, the protrusions 52 and the depression 53 are alternately arranged on the heat storage plate 23 in two directions which are perpendicular to each other and which are parallel to the upper surface 23*a* of the heat storage plate 23.

Consequently, since wettability (in other words, ease of wetting) of the upper surface 23*a* of the heat storage plate 23 by the liquid material can be enhanced in the two directions described above or, in other words, since wetting of the upper surface 23*a* of the heat storage plate 23 by the liquid material can be promoted in the two directions described above, a contact area between the liquid material and the upper surface 23*a* of the heat storage plate 23 can be further increased. As a result, vaporization of the liquid material can be further promoted.

A configuration is adopted in which, based on an inputted set supply and a detection result of the position sensor 63, the electro-pneumatic regulator 34 is driven to supply liquid material corresponding to the set supply to the vaporizer 12 with the pump 11. In this case, since a necessary amount of the liquid material for surface treatment can be supplied by the pump 11 to the vaporizer 12 from the liquid tank X, the liquid material in the liquid tank X can be kept in a fresh state without vaporizing the liquid material.

The present liquid vaporization system 10 is provided with the liquid vaporization apparatus 20 having the pump 11, the vaporizer 12, the suction valve 13, the discharge valve 14, and the discharge passage 16. In this case, since the present apparatus 20 that is provided on an upstream side of the chamber 18 can be compactly configured, the present apparatus 20 can be arranged in a vicinity of the chamber 18. Consequently, since a length of the gas discharge pipe 29 that connects the present apparatus 20 (specifically, the vaporizer 12) with the chamber 18 can be relatively shortened, re-liquefaction of the liquid material vaporized by the vaporizer 12 can be suppressed in the pipe 29 before being supplied to the chamber 18.

Since the liquid adhering surface (the upper surface 23*a* of the heat storage plate 23) to which the liquid material is adhered for heating is formed in a flat shape, even if vaporization heat is taken from the upper surface 23*a* of the heat storage plate 23 due to vaporization of the liquid material and a temperature of the upper surface 23*a* drops locally, heat can be promptly supplied to the low temperature portion. Consequently, a temperature of a heating surface (liquid adhering surface) for heating the liquid material can be kept uniform.

(Second Embodiment)

Figure 5:
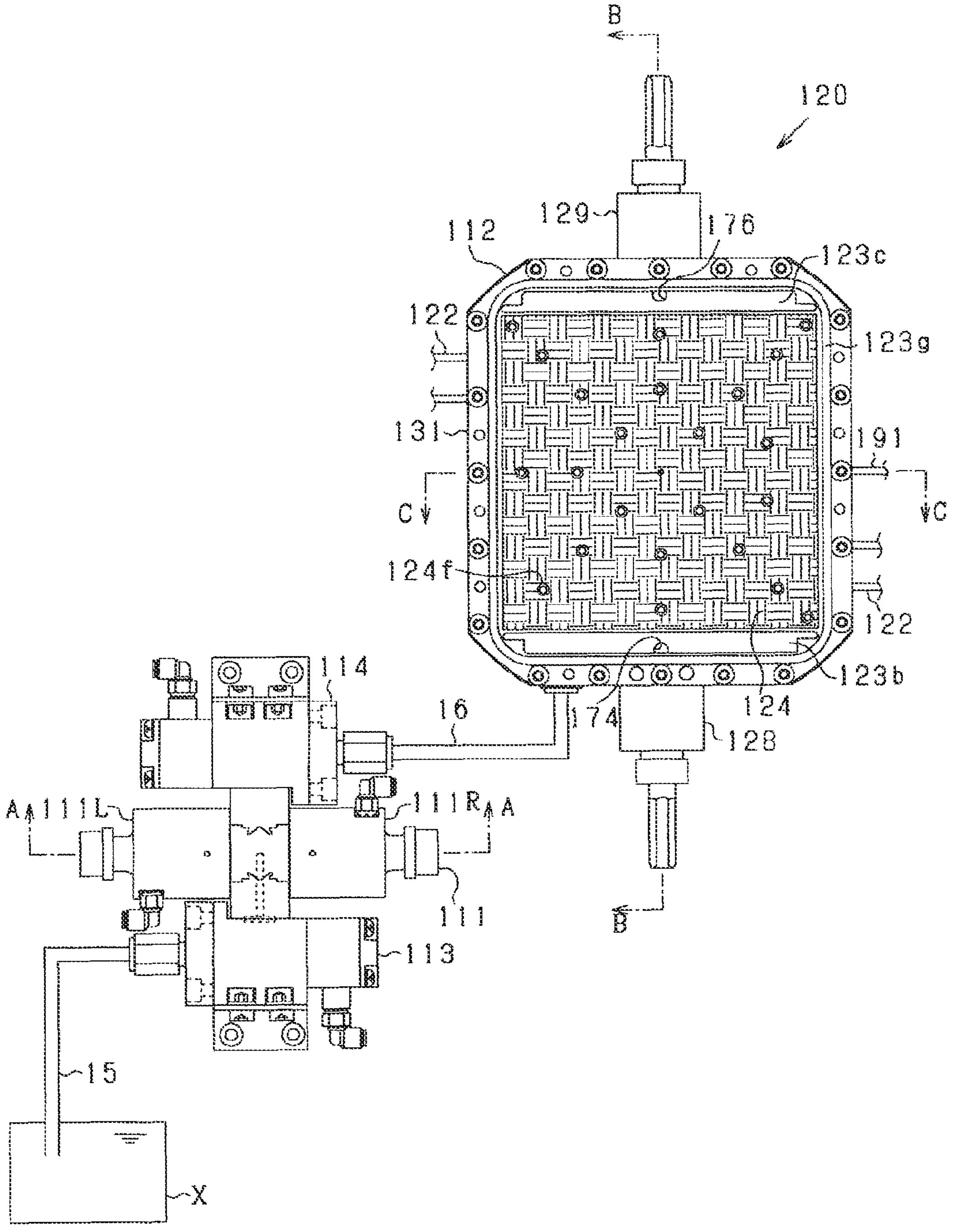
FIG. 5 is a plan view showing a configuration of a liquid vaporization apparatus according to a second embodiment.

Next, a second embodiment of the present invention will be described with reference to FIG. 5, focusing on a difference with the first embodiment. A liquid vaporization system 10 according to the present embodiment differs from that of the first embodiment in a configuration of a liquid vaporization apparatus 120 and contents of control by a controller 40, and shares other components. FIG. 5 is a plan view showing a configuration of the liquid vaporization apparatus 120 according to the second embodiment. While the liquid vaporization apparatus 120 according to the present embodiment shares a common feature with the first embodiment in that a liquid material is vaporized using a mesh 124, the present embodiment differs in that the liquid material is supplied between the mesh 124 and a liquid adhering surface (to be described later).

The liquid vaporization apparatus 120 has a pump 111, a vaporizer 112, a suction valve 113, and a discharge valve 114 which are interconnected by a discharge passage 16 that supplies a liquid material. The pump 111 is connected to a liquid tank X via the suction valve 113 and a suction passage 15 and to the vaporizer 112 via the discharge valve 114 and the discharge passage 16. In a similar manner to the first embodiment, the pump 111 is operated by the controller 40 together with the suction valve 113 and the discharge valve 114, and supplies the liquid material to the vaporizer 112. The vaporizer 112 vaporizes the liquid material using a heater 122 and the mesh 124, mixes the vaporized gas with nitrogen gas supplied from a gas inlet pipe 128, and discharges the mixture gas from a gas discharge pipe 129.

Figure 6:
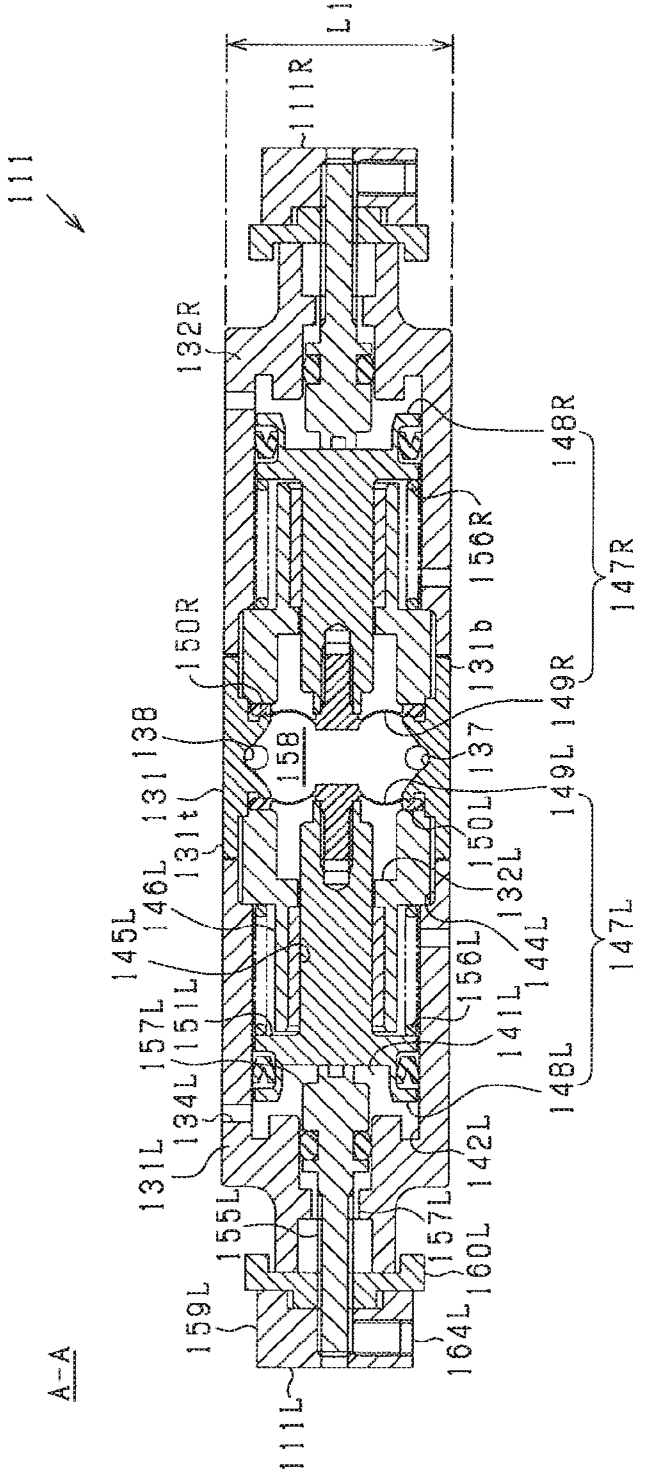
FIG. 6 is a sectional view showing an internal configuration of a pump.

FIG. 6 is a sectional view showing an internal configuration of the pump 111. The pump 111 is a twin diaphragm pump and has a first valve unit 111L having a valve member 147L, a second valve unit 111R having a valve member 147R, and a joining body 131. The joining body 131 joins the first valve unit 111L and the second valve unit 111R by screwing at both ends of the joining body 131 so that the first valve unit 111L and the second valve unit 111R oppose each other. The pump 111 has a thin rectangular parallelepiped exterior shape having a thickness L1 suppressed by optimizing mounting arrangement (to be described later). The joining body 131 is made of, for example, a fluororesin and is also referred to as a joining section.

The first valve unit 111L and the second valve unit 11R share the same configuration (or have symmetrical configurations) and are fastened (screwed) to the joining body 131 in directions opposite to each other. The valve member 147L is configured by integrating a diaphragm valve element 149L and a rod 148L, wherein the diaphragm valve element 149L is joined to one end of the rod 148L. The valve member 147R is configured by integrating a diaphragm valve element 149R and a rod 148R, wherein the diaphragm valve element 149R is joined to one end of the rod 148R. The diaphragm valve element 149L and the diaphragm valve element 149R are formed by, for example, a fluororesin.

At the joining body 131, the diaphragm valve element 149L and the diaphragm valve element 149R form surfaces that oppose each other in a pump chamber 158. In other words, the diaphragm valve element 149L and the diaphragm valve element 149R form surfaces of a pump chamber 158 that oppose each other. Accordingly, diameters of the diaphragm valve element 149L and the diaphragm valve element 149R can be suppressed while securing a capacity variation of the pump chamber. Such suppression of diameters reduces the size of the pump chamber 158 and expands the possibility of design in order to suppress the thickness L1.

Moreover, the first valve unit 111L and the second valve unit 111R are also respectively referred to as a first diaphragm driving unit and a second diaphragm driving unit. The diaphragm valve element 149L and the diaphragm valve element 149R are also respectively referred to as a first diaphragm and a second diaphragm.

The joining body 131 forms the pump chamber 158 together with the diaphragm valve element 149L and the diaphragm valve element 149R. A suction passage 137 and a discharge passage 138 are connected to the pump chamber 158. As shown in FIGS. 5 and 6, the joining body 131 has a rectangular parallelepiped external shape having an upper surface 131*t* and a bottom surface 131*b*. The pump 111 is configured so that the upper surface 131*t* is arranged on an upper side and the bottom surface 131*b* is arranged on a lower side relative to a direction of gravity in a mounted state, and both the upper surface 131*t*, and the bottom surface 131*b* are parallel to a horizontal plane.

In this manner, in the pump 111, the diaphragm valve element 149L and the diaphragm valve element 149R are arranged at positions which sandwich the pump chamber 158 from both sides (opposing positions). Due to such a mounting arrangement, a space for arranging components of the first valve unit 111L and the second valve unit 111R can be utilized effectively in a direction extending in an opposing direction of the valve units 111L and 111R. Accordingly, a distance between the upper surface 131*t* and the bottom surface 131*b* can be reduced and a height L1 of the pump 111 in a direction of gravity can be reduced.

Furthermore, in a horizontal plane, the suction passage 137 and the discharge passage 138 are arranged in a direction perpendicular (opposing direction) to a direction in which the diaphragm valve element 149L and the diaphragm valve element 149R operate. In addition, as shown in FIG. 5, the suction valve 113 and the discharge valve 114 are respectively connected to the suction passage 137 and the discharge passage 138. This enables efficient use of a space for arranging components such as valves to be connected to the suction passage and the discharge passage in a direction perpendicular to a space in which components for driving the diaphragms are arranged. Inside a horizontal plane means inside a horizontal plane with respect to a direction of gravity.

As described above, the present inventors have succeeded in reducing the thickness L1 of the pump 111 by realizing suppression of the size of the pump chamber 158 through the operation of the diaphragm valve element 149L and the diaphragm valve element 149R in opposing directions and by realizing an efficient mounting arrangement with hardly any waste in a horizontal plane.

Moreover, while the suction passage 137 and the discharge passage 138 are arranged in a direction perpendicular (opposing direction) to a direction in which the diaphragm valve element 149L and the diaphragm valve element 149R operate in the embodiment described above, the arrangement direction need not necessarily be perpendicular and an intersecting direction may suffice. However, the closer to perpendicular, the higher the mounting efficiency.

Figure 7:
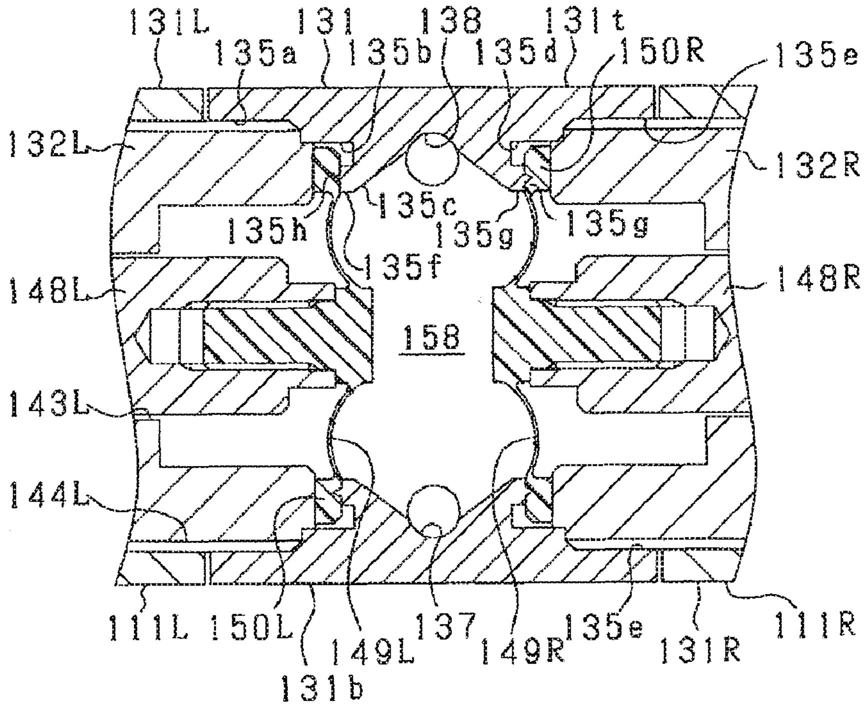
FIG. 7 is an enlarged sectional view showing an internal structure of a joining body.

FIG. 7 is an enlarged sectional view showing an internal structure of the joining body 131. In the joining body 131, a plurality of through holes with inner diameters that differ from each other are communicated in a movement direction (opposing direction) of the rod 148L and the rod 148R. The plurality of through holes are, in sequence from an outer side of the joining body 131, a pair of outer through holes 135*a* and 135*e*, a pair of inner through holes 135*b* and 135*d*, and a central through hole 135*c*, which are communicated with each other as coaxial (having a same central axis) through holes. In the present embodiment, these holes communicate coaxially with a common central axis.

The outer through holes 135*a* and 135*e* and the inner through holes 135*b* and 135*d* respectively have cylindrical shapes with a constant inner diameter. On the other hand, the central through hole 135*c* has a shape in which an inner diameter increases the closer to a central part (deepest part). At the central part of the central through hole 135*c*, the discharge passage 138 is connected to a topmost part in a direction of gravity and the suction passage 137 is connected to a bottommost part. Due to such an inner shape and a connection state of the central through hole 135*c*, even if bubbles are created inside the pump chamber 158, the bubbles are to be smoothly discharged from the discharge passage 138 by the liquid material suctioned from the suction passage 137.

A stem 132L included in the first valve unit 111L is screwed to the outer through hole 135*a*. A valve supporting hole 143L into which the rod 148L is inserted is formed on the stem 132L. A central part side of the diaphragm valve element 149L is connected to the rod 148L. An outer edge part 150L on an end side of the diaphragm valve element 149L is held by the stem 132L and a supporting portion 135*f* of the joining body 131. A donut-shaped region (membrane region) between the central part side and the end side of the diaphragm valve element 149L has a protruding shape that protrudes toward the rod 148L and is configured so as to enable a smooth elastic deformation due to a reciprocative movement of the rod 148L.

On the other hand, a stem 132R of the second valve unit 111R is screwed to the outer through hole 135*e* of the joining body 131. An outer edge part 150R on an end side of the diaphragm valve element 149R is held by the stem 132R and a supporting portion 135*g* of the joining body 131. The respective components of the second valve unit 111R or, in other words, the stem 132R, the rod 148R, and the outer edge part 150R are configured symmetrical to the respective components of the first valve unit 111L. Since the second valve unit 111R is configured symmetrical to the respective components of the first valve unit 111L, hereinafter, details of the configuration of the second valve unit 111R provided in the description of the first valve unit 111L will be applied to the description of the second valve unit 111R.

A first valve unit main body 131L is screwed to a screw portion of the stem 132L. As shown in FIG. 6, a cylinder portion 142L which has an approximately columnar shape and which opens to a side of the joining body 131 and a stem supporting hole 144L which communicates with the cylinder portion 142L are formed on the first valve unit main body 131L. The stem 132L is screwed to a screw portion of the stem supporting hole 144L. The first valve unit main body 131L is made of a light-weight material such as polypropylene resin and aluminum.

As shown in FIG. 6, a guide supporting portion 146L is formed on the stem 132L on an opposite side to the joining body 131. The guide supporting portion 146L is a protrusion which has a cylindrical shape and which supports a guide 145L. The guide 145L has a cylindrical shape and is arranged inside the guide supporting portion 146L. The guide 145L supports the rod 148L so that the rod 148L is slidable inside the guide supporting portion 146L in a movement direction of the rod 148L. A piston portion 151L with an approximately disk-like shape and which has an outside diameter that is the same as an inner diameter of the cylinder portion 142L is formed on the rod 148L. An outer circumferential part of the piston portion 151L is in contact with an inner surface of the cylinder portion 142L, and the piston portion 151L is slidably housed in the cylinder portion 142L.

The cylinder portion 142L is divided into two spaces by the piston portion 151L of the rod 148L. Among the two spaces, a space on a side of a stroke limiting member 157L of the piston portion 151L constitutes a pressure control chamber 141L. Operating air is introduced into the pressure control chamber 141L from the outside via an air inlet passage 134L formed in the first valve unit main body 131L, and by pressurizing the inside of the pressure control chamber 141L with the operating air, the valve member 147L can be moved toward the joining body 131. On the other hand, the stem 132L biases the rod 148L in an opposite direction to the joining body 131 with a spiral coil-shaped spring 156L via the piston portion 151L. Accordingly, reciprocation of the rod 148L is achieved.

Movement of the rod 148L in a direction opposite to the side of the joining body 131 is limited by the stroke limiting member 157L. The stroke limiting member 157L has a screw portion 155L and is screwed to the first valve unit main body 131L by the screw portion 155L. The screw portion 155L is capable of moving (adjusting) the stroke limiting member 157L relative to the first valve unit main body 131L by a relative rotation between the stroke limiting member 157L and the first valve unit main body 131L. Due to this relative movement, the stroke limiting member 157L can adjustably limit a movement range of the rod 148L on an opposite side to the joining body 131. The movement range of the rod 148L is fixedly limited on the side of the joining body 131 by the guide supporting portion 146L. The movement ranges of the rod 148L and the rod 148R are also respectively referred to as a first displacement and a second displacement.

The stroke limiting member 157L is fixed by a double nut that uses an upper nut 159L and a lower nut 160L. The upper nut 159L further uses a stud 164L to suppress rotation relative to the stroke limiting member 157L. The stroke limiting member 157L can be adjusted by first loosening the upper nut 159L when the stud 164L is in a loosened state, and then loosening the lower nut 160L.

The angles of rotation of the stroke limiting member 157L and the stroke limiting member 157R can respectively be checked by graduations (not shown) formed on the first valve unit main body 131L and the first valve unit main body 131R. The graduations has a configuration (angle measuring unit) similar to a micrometer that is capable of measuring ranges of displacement of the stroke limiting member 157L and the stroke limiting member 157R in micron units. The stroke limiting member 157L and the stroke limiting member 157R are also respectively referred to as a first displacement limiting unit and a second displacement limiting unit. Rotations of the stroke limiting member 157L and the stroke limiting member 157R are also respectively referred to as a first rotation and a second rotation.

Consequently, a discharge amount can be set to various amounts depending on a specification of a vaporization amount without having to perform actual measurements. The discharge amount signifies an amount per stroke. Moreover, such a configuration can also be realized in various modes such as a dial gauge and a digital micrometer which indicate a value related to a discharge amount measured in accordance with an angle of rotation, and is also referred to as a measuring unit. Note that "a value related to a discharge amount" is used in a broad sense so as to include values related to a discharge amount such as a feed of the stroke limiting member 157L and a feed of the stroke limiting member 157R which is attributable to an angle of rotation.

In the present embodiment, the strokes of the rod 148L and the rod 148R are set so that exactly 100 μL of the liquid material is discharged in one reciprocation. Regarding this setting, for example, reciprocation of six cycles in one minute realizes vaporization at a rate (speed) of 600 μL per minute.

Figure 8:
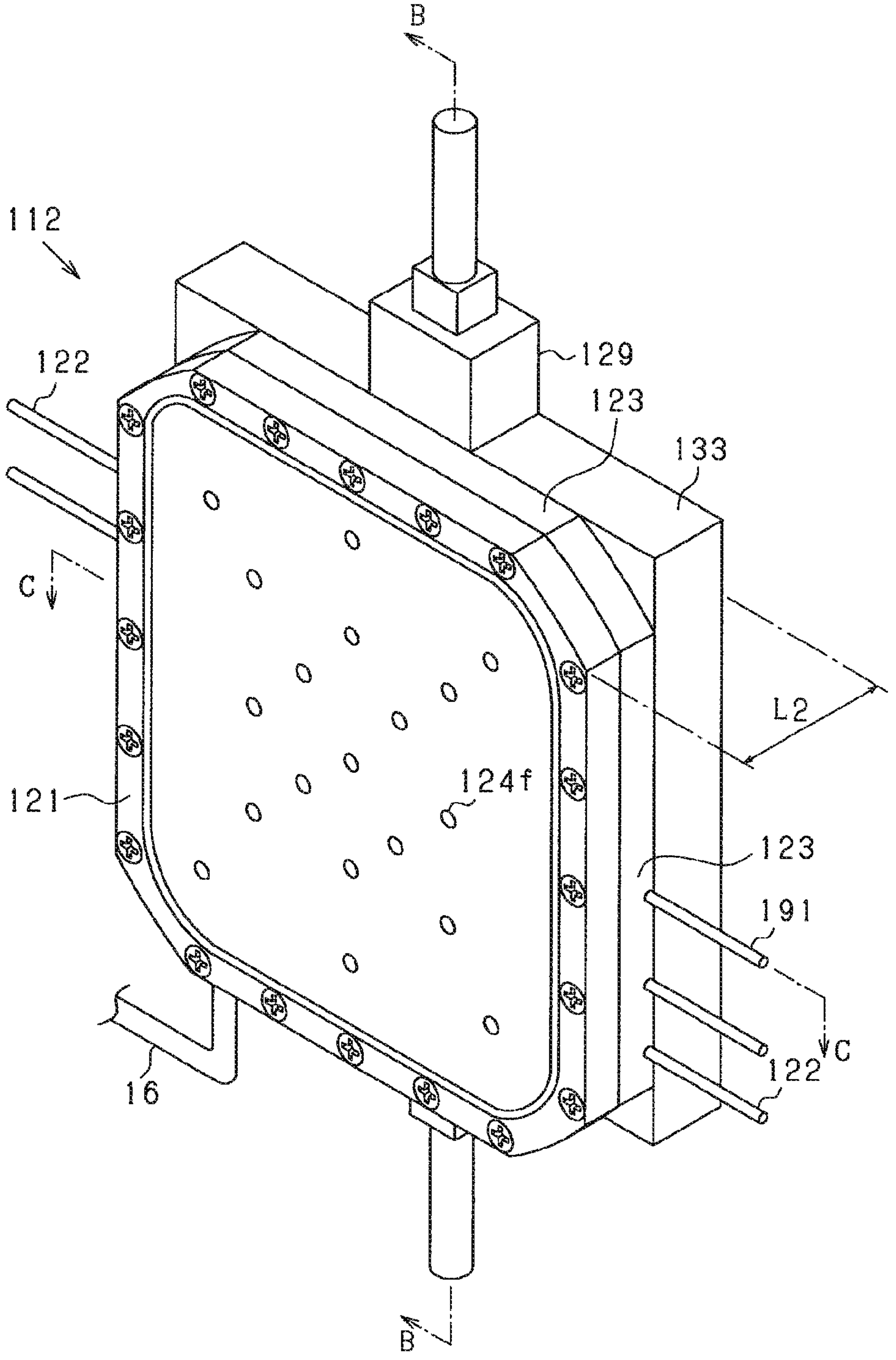
FIG. 8 is a perspective view showing an exterior of a vaporizer.
Figure 9:
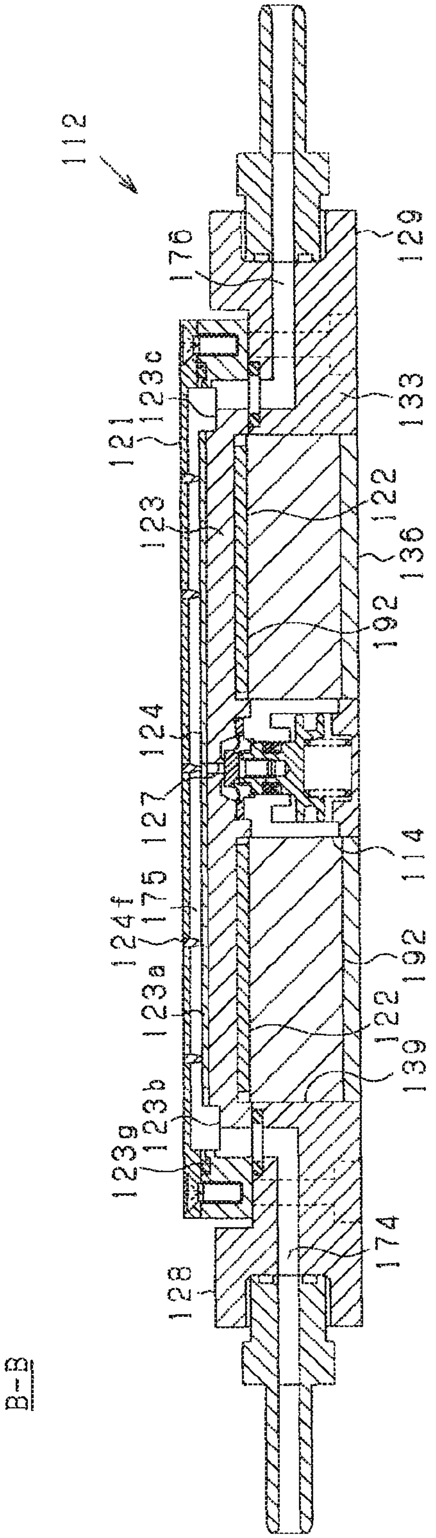
FIG. 9 is a sectional view showing a cross section of a vaporizer.
Figure 10:
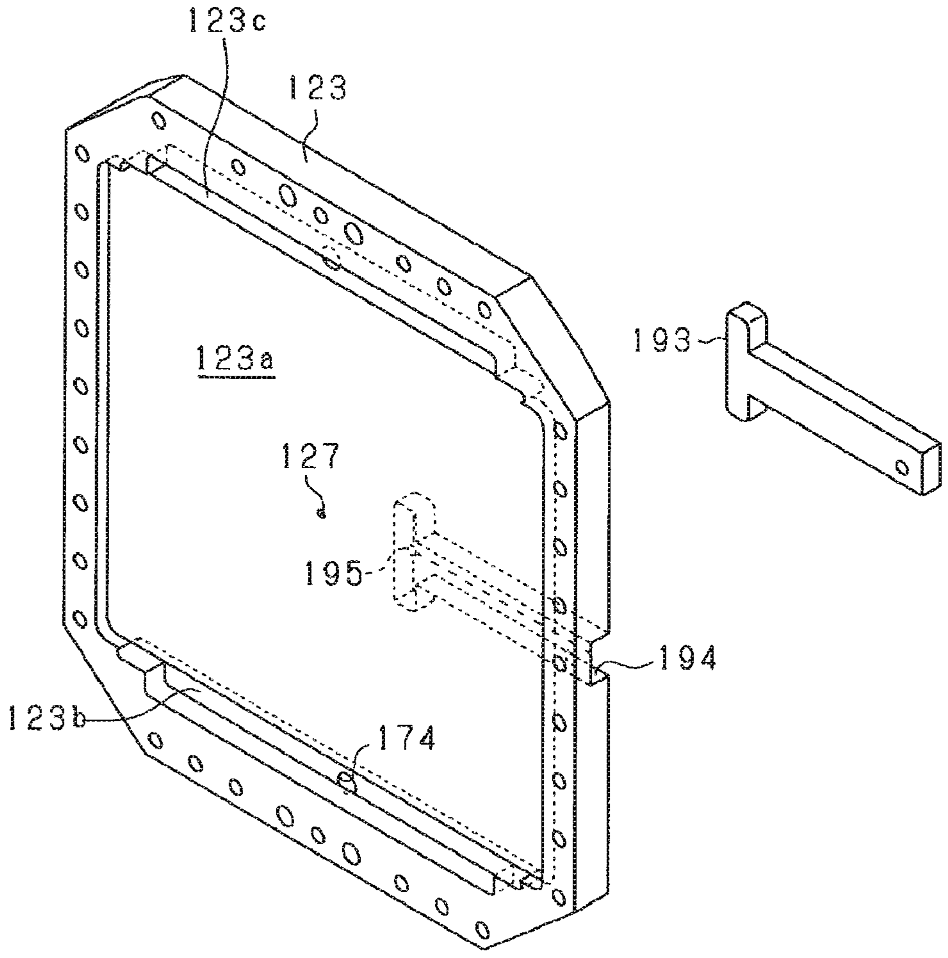
FIG. 10 is a perspective view showing a heat storage plate of a vaporizer.
Figure 11:
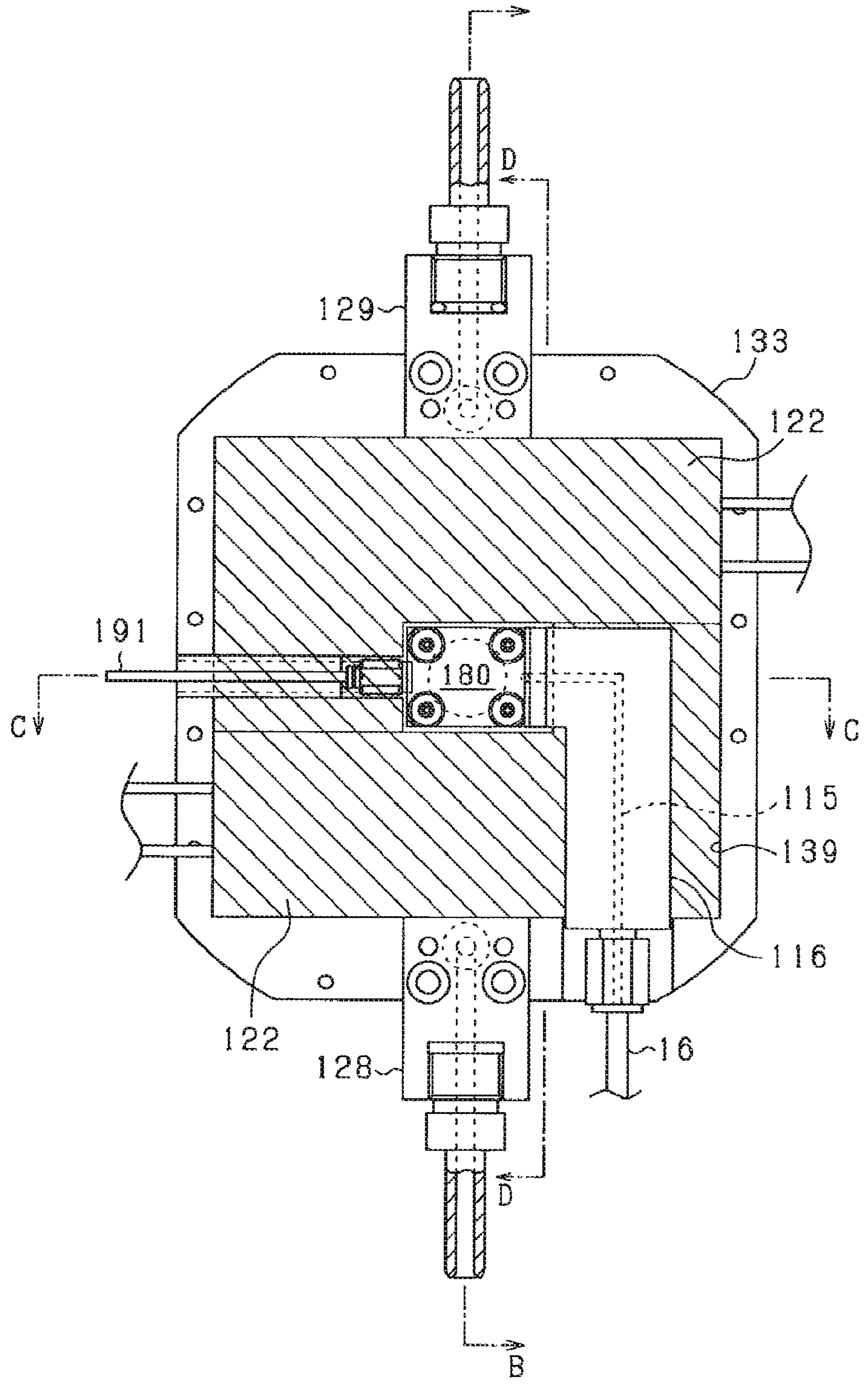
FIG. 11 is an internal structural diagram in which an inside of a vaporizer is viewed from below (relative to gravity in a mounted state)
Figure 12:
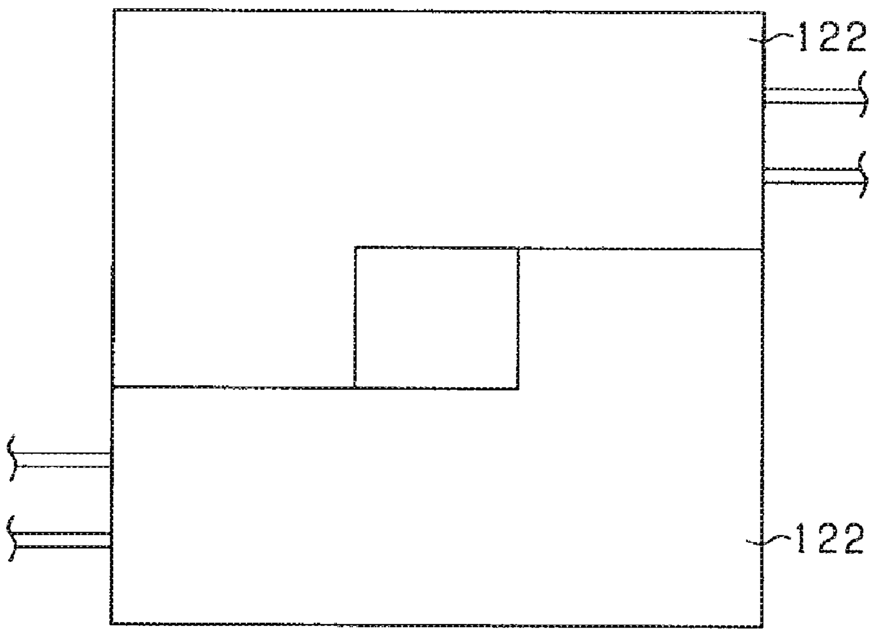
FIG. 12 is a bottom view showing a state in which a heater of a vaporizer is viewed from below.
Figure 13:
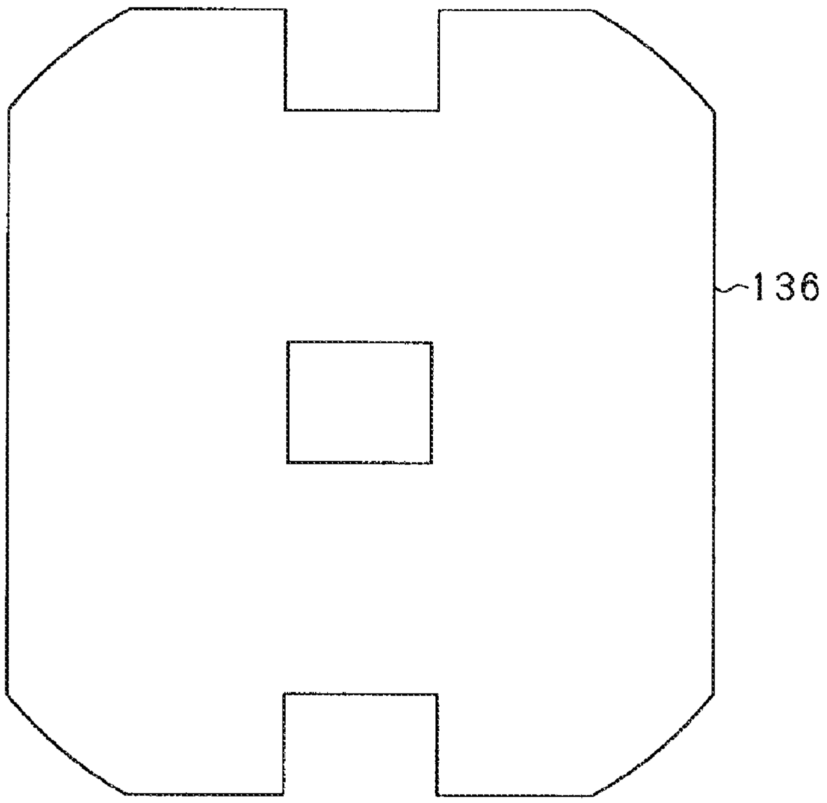
FIG. 13 is a bottom view showing a state in which a back lid of a vaporizer is viewed from below.

Next, the vaporizer 112 according to the second embodiment will be described with reference to FIGS. 8 to 13, focusing on a difference with the vaporizer 12 according to the first embodiment. FIG. 8 is a perspective view showing an exterior of the vaporizer 112 according to the second embodiment. FIG. 9 is a sectional view showing a cross section of the vaporizer 112 according to the second embodiment. FIG. 10 is a perspective view showing a heat storage plate 123 of the vaporizer 112. FIG. 11 is an internal structural diagram in which an interior of the vaporizer 112 according to the second embodiment is viewed from below. FIG. 12 is a bottom view showing a state in which a heater 122 of the vaporizer 112 is viewed from below. FIG. 13 is a bottom view showing a state in which a back lid 136 of the vaporizer 112 is viewed from below. "Below" refers to a direction relative to gravity in a mounted state of the vaporizer 112 and to a side opposite to the cover 121.

As shown in FIG. 8, the vaporizer 112 according to the second embodiment has a structure in which the cover 121, the heat storage plate 123, and a vaporizer main body 133 are stacked in order, and has a thin rectangular parallelepiped exterior shape having a thickness L2 suppressed in the same manner as the pump 111. While the cover 121 is made of a transparent resin in the present embodiment, the cover 121 may alternatively be made of an opaque material. The heat storage plate 123 is made of a rectangular plate material formed by silicon carbide or an aluminum material which have superior thermal conductivity in the same manner as in the first embodiment. However, a configuration using a transparent material is advantageous in that a state of vaporization can be visually confirmed. By arranging the vaporizer 112 in a same plane as the pump 111, the entire liquid vaporization apparatus 120 can be configured as a thin system.

In the vaporizer 112 according to the second embodiment, the liquid material is supplied between a liquid adhering surface 123*a* and the mesh 124 via an orifice 127 formed on the heat storage plate 123, which differs from the first embodiment (refer to FIG. 2) in which the liquid material is dropped onto the mesh 24 from a side opposite (upper side) to the liquid adhering surface 123*a*. In the configuration described below, since the liquid material can flow through a gap between the mesh 124 and the liquid adhering surface 123*a* due to interfacial tension, the liquid material can be supplied over a wide area of the mesh 124.

As shown in FIG. 9, the orifice 127 is formed at an approximately central part of the heat storage plate 123 to enable the liquid material to be supplied from an approximately central part of the liquid adhering surface 123*a*. A shutoff valve 180 is connected to the orifice 127 and enables a flow of the liquid material to be shut off at the orifice 127. As shown in FIG. 11, a flow channel unit 116 in which an inner flow channel 115 for supplying the liquid material is formed and a pipe 191 for supplying activating air that is used to control the supply of the liquid material are connected to the shutoff valve 180 in direction in which the shutoff valve 180 is sandwiched by the flow channel unit 116 and the inner flow channel 115. The direction is set approximately perpendicular to a direction in which the heat storage plate 123 is sandwiched by the gas inlet pipe 128 and the gas discharge pipe 129.

Around the shutoff valve 180 on a rear surface of the vaporizer main body 133 which is provided on a lower surface of the heat storage plate 123, two heaters 122 (refer to FIG. 12) which supply heat to the heat storage plate 123 are mounted to a depression 139 of the vaporizer main body 133. As shown in FIG. 11, the flow channel unit 116 and the pipe 191 are arranged on a lower surface of the two heaters 122 in the depression 139. As shown in FIG. 9, an elastic heat insulating material 192 is arranged on low surfaces of the respective heaters 122 around the shutoff valve 180, the flow channel unit 116, and the pipe 191.

The back lid 136 (refer to FIG. 13) is fixed to a rear surface of the vaporizer 112 in a state in which the heat insulating material 192 is elastically deformed (in a state in which a load is applied). Note that in FIG. 11, certain parts (the back lid 136 and the heat insulating material 192) have been omitted to better show an internal structure.

As shown in FIG. 12, the heater 122 is a rubber heater formed into an L-shaped flat plate. A rubber heater has a configuration in which an exotherm is covered by an elastic thin silicon rubber. A rubber heater is advantageous that the rubber heater securely fits a heating surface and that assembly may be easily performed. The mesh 124 is formed by interweaving a plurality of stainless-steel wires 24*a* arranged vertically and horizontally in the same manner as in the first embodiment shown in FIG. 5, and has an overall flat plate shape.

As shown in FIG. 10, the heat storage plate 123 has the liquid adhering surface 123*a* which is significantly larger in comparison to the first embodiment. A depression 194 in which a thermocouple 195 is arranged is formed on a rear surface of the liquid adhering surface 123*a*. Since the depression 194 is formed on the rear surface (a surface opposite to the liquid adhering surface 123*a*) of the heat storage plate 123, airtightness on the side of the liquid adhering surface 123*a* can be secured. By arranging a deeper depression 194 that reaches a vicinity of the liquid adhering surface 123*a* or, in other words, by reducing a plate thickness between the depression 194 and the liquid adhering surface 123*a*, a temperature of the liquid adhering surface 123*a* can be measured accurately with a small time lag.

The thermocouple 195 is connected to the controller 40 and is used to monitor a state of vaporization in the present embodiment. A thermocouple cover 193 that covers the thermocouple 195 is mounted to the depression 194. Note that FIG. 10 shows a state in which the thermocouple cover 193 has been removed for the sake of illustration. In addition, a procedure of state monitoring will be described later.

As shown in FIGS. 8 and 9, the mesh 124 is pressed against the liquid adhering surface 123*a* by a plurality of pins 124*f* arranged at a predetermined pitch so as to prevent the mesh 124 from becoming excessively separated from the liquid adhering surface 123*a*. The plurality of pins 124*f* are made of, for example, a fluororesin, and are fixed to the cover 121. Due to such a configuration, since the liquid material can flow through a gap between the mesh 124 and the liquid adhering surface 123*a* due to interfacial tension, the liquid material can be supplied over a wide area of the mesh 124. One of the plurality of pins 124*f* is arranged at a position that opposes an outlet of the orifice 127. Consequently, the mesh 124 can be prevented from colliding with the cover 121 attributable to a deformation of the mesh 124 caused by the liquid material discharged from the orifice 127. The outlet of the orifice 127 is also referred to as a supply port.

As described above, since a gap flow is formed among a plurality of pressing positions (pins 124*f*), the possibility of design can be expanded with respect to mesh roughness, a positional relationship among the plurality of pins 124*f* and so on. Consequently, a design tool can be provided for realizing an appropriate gap flow in accordance with required specifications. The pins 124*f* may be configured as a plurality of members respectively arranged at the plurality of positions where the mesh is pressed or may include a common member having a plurality of protrusions for pressing.

As shown in FIG. 9, a vaporization flow channel 175 through which nitrogen gas flows faces the mesh 124, and vaporized liquid material is mixed with the nitrogen gas. Nitrogen gas is supplied to the vaporization flow channel 175 via, in sequence, an inlet passage 174 and a groove portion 123*b* of the gas inlet pipe 128. The groove portion 123*b* is formed so as to supply, in a dispersed manner in a horizontal plane, nitrogen gas supplied from the inlet passage 174 to the mesh 124. On the other hand, nitrogen gas mixed with the liquid material is discharged from the vaporization flow channel 175 via, in sequence, a groove portion 123*c* and a discharge passage 176 of the gas discharge pipe 129. The groove portion 123*c* is formed so as to collect mixture gas from a wide surface of the mesh 124 and discharge the mixture gas to the discharge passage 176. As shown in FIGS. 5 and 9, the vaporization flow channel 175 is kept in an airtight state by a gasket 123*g* mounted between the cover 121 and the heat storage plate 123.

Figure 14:
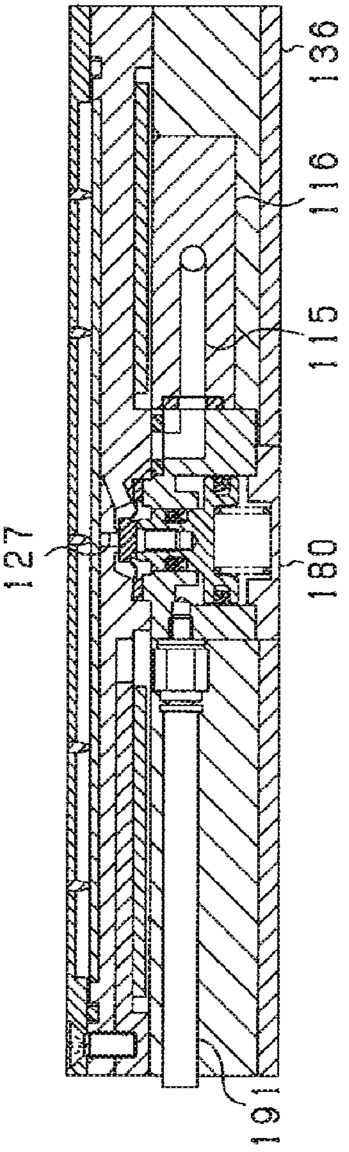
FIG. 14 is a sectional view showing a cross section of a vaporizer.
Figure 15:
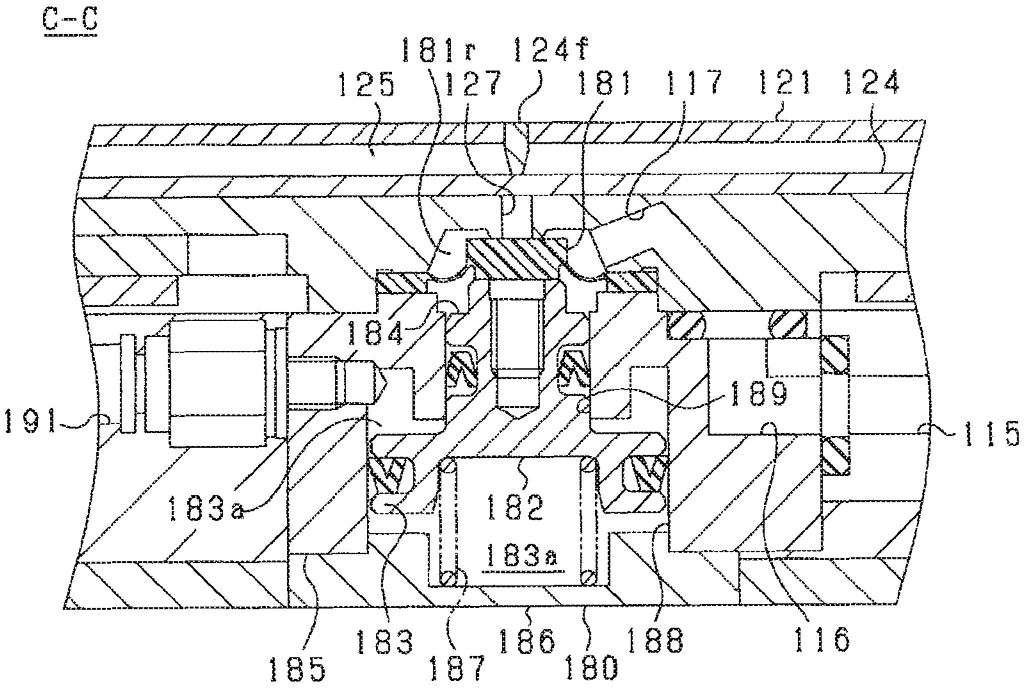
FIG. 15 is an enlarged sectional view showing a state in which an orifice is closed by a shutoff valve.
Figure 16:
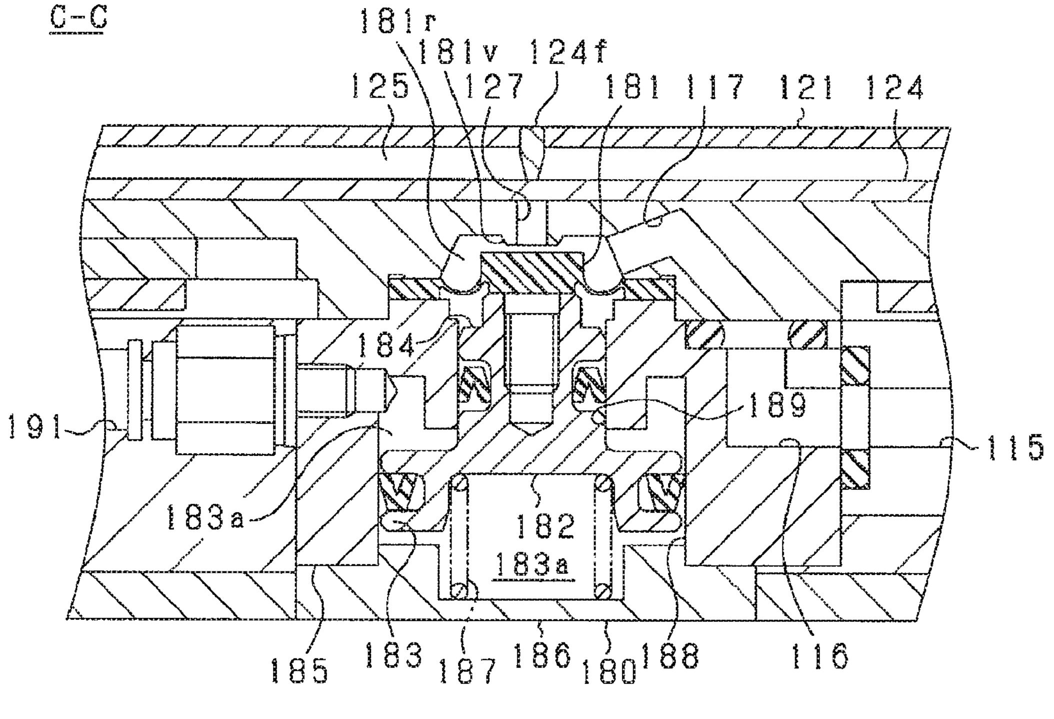
FIG. 16 is an enlarged sectional view showing a state in which an orifice is opened by a shutoff valve.

Next, a method of supplying the liquid material to the liquid adhering surface 123*a* of the vaporizer 112 will be described with reference to FIGS. 14 to 16. FIG. 14 is a sectional view showing a cross section of the vaporizer 112. FIG. 15 is an enlarged sectional view showing a state in which the orifice 127 is closed by the shutoff valve 180. FIG. 16 is an enlarged sectional view showing a state in which the orifice 127 is opened by the shutoff valve 180.

As shown in FIG. 14, the vaporizer 112 according to the second embodiment differs from the first embodiment in that the shutoff valve 180 is provided in a liquid material supply channel. The shutoff valve 180 can effectively suppress leakage of the liquid material and creation of bubbles in a supply flow channel which are attributable to vaporization of the liquid material in the supply flow channel after supplying of the liquid material is stopped. In consideration of the fact that such leakage and the creation of bubbles cause errors in the supply of the liquid material, the present embodiment has an advantage of significantly improving the accuracy of the supply of the liquid material by effectively suppressing such errors.

The liquid material is supplied to the shutoff valve 180 via the inner flow channel 115 formed in the flow channel unit 116. The shutoff valve 180 operates supply of the liquid material to the orifice 127 using operating air that is supplied via the pipe 191.

The shutoff valve 180 with a diaphragm structure is connected to the orifice 127. As shown in FIGS. 15 and 16, the shutoff valve 180 can operate the orifice 127 to open and close by moving a diaphragm valve 181 in a flow channel-direction of the orifice 127. In this manner, in the second embodiment, since the orifice 127 formed inside the heat storage plate 123 is directly shut off by the diaphragm valve 181, an inconvenience such as a fluctuation of a vaporization amount attributable to the liquid material remaining in the discharge passage can be avoided. Since an amount of liquid material residue in the discharge passage is extremely small and the residue vaporizes immediately due to heat, the residue does not cause fluctuation.

The orifice 127 is formed in the heat storage plate 123 as a flow channel between an outlet on the side of the mesh 124 and an inlet on the side of the shutoff valve 180. The outlet on the side of the mesh 124 is also referred to as a supply port. The inlet on the side of the shutoff valve 180 opens to a depression that constitutes a flow channel chamber 181*r*, and has a valve seat 181*v*. In other words, the valve seat 181*v* is formed around the inlet on the side of the shutoff valve 180. The inlet on the side of the shutoff valve 180 is also referred to as a rear surface opening and is formed at a position on the orifice 127 which opposes the supply port. Due to a configuration that includes such a depression, a length of a flow channel between the supply port and the rear surface opening can be shortened regardless of a thickness of the heat storage plate 123. In addition, by adjusting a depth of the depression, the length of the flow channel can be freely set.

Meanwhile, the present inventors have found that activation of the diaphragm valve 181 has a minute influence (reduction) on the discharge amount of the liquid material. The present inventors have discovered that the influence on the discharge amount is caused by an expansion of a capacity of the flow channel chamber 181*r* due to activation of the diaphragm valve 181. This is because an expansion of the capacity of the flow channel chamber 181*r* absorbs a part of the liquid material supplied to the shutoff valve 180 and reduces supply to the orifice 127. However, the present inventors have also found that the capacity expansion is reproducible and can be readily solved by setting a discharge amount that makes an allowance for a reduction in the discharge amount attributable to the capacity expansion.

A rod 182 is connected to the diaphragm valve 181. A slide portion 184 and a piston portion 183 are formed on the rod 182. The slide portion 184 slides inside a guide portion 189 that is a cylindrical depression formed on a shutoff valve main body 185. The piston portion 183 slides inside a cylinder portion 188 which is formed so as to communicate with the guide portion 189 inside the shutoff valve main body 185, and demarcates a pressure control chamber 183*a*. The rod 182 is biased by a spiral coil-shaped spring 187 in a direction in which the orifice 127 is closed by the diaphragm valve 181. The rod 182 can be operated in a direction in an opening direction of the orifice 127 by pressurization of the pressure control chamber 183*a*. The spring 187 is fixed by a back lid 186.

Figure 17:
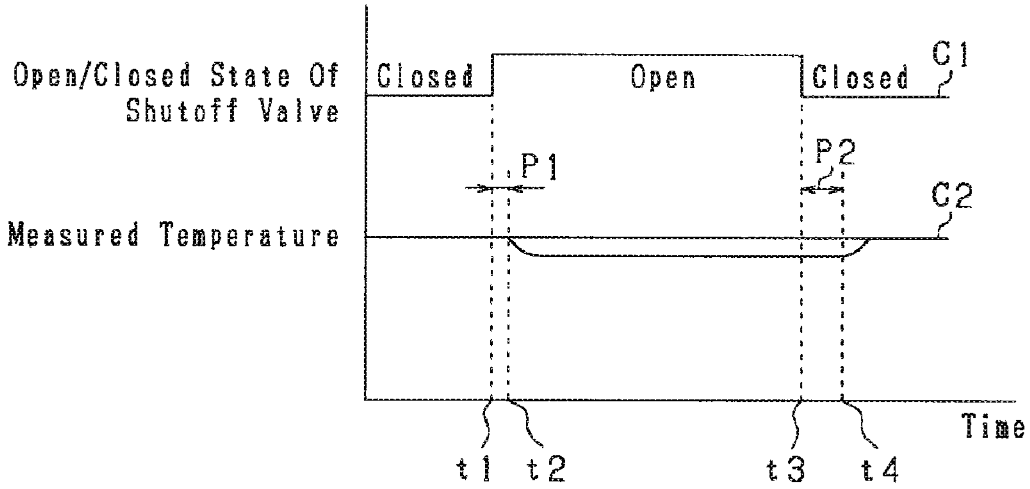
FIG. 17 is a graph showing a relationship between an open/closed state of a shutoff valve and a measured temperature of a thermocouple.

Next, monitoring of a state of vaporization of the liquid material to the liquid adhering surface 123*a* of the vaporizer 112 will be described with reference to FIG. 17. FIG. 17 is a graph showing a relationship between an open/closed state of the shutoff valve 180 and a measured temperature of the thermocouple 195 (refer to FIG. 10). In FIG. 17, an abscissa represents time and an ordinate represents an open/closed state of the valve and a measured temperature. A line C1 represents an open/closed state of the shutoff valve 180. A line C2 represents a measured temperature of the thermocouple 195. Temperatures are measured by the thermocouple 195 because a thermocouple has high responsiveness and favorable properties with respect to a detection of a small temperature variation attributable to a start or finish of vaporization.

A state of vaporization of the liquid material is monitored as follows. At time t1, the controller 40 supplies operating air from the pipe 191 and changes the shutoff valve 180 from a closed state (refer to FIG. 15) to an open state (refer to FIG. 16). The controller 40 starts monitoring of the measured temperature of the thermocouple 195 in response to a start of the open state of the shutoff valve 180 (the start of supply of the liquid material), and measures an elapsed period of time P1 until a drop in temperature attributable to vaporization is detected. Based on the elapsed period of time P1 until the start of vaporization and on a preset reference range, the controller 40 is able to confirm that a process from the start of supply of the liquid material to the start of vaporization is normal.

Next, the controller 40 starts monitoring of the measured temperature of the thermocouple 195 in response to a start of the closed state of the shutoff valve 180 (the end of supply of the liquid material), and measures an elapsed period of time P2 until a rise in temperature attributable to the end of vaporization is detected. Based on the elapsed period of time P2 and on a preset reference range, the controller 40 is able to confirm that a process from the end of supply of the liquid material to the finish of vaporization is normal. In addition, a rise in temperature can also be detected as an unexpected termination of vaporization during the vaporization process (failure detection).

On the other hand, in the present embodiment, temperature control of the heat storage plate 123 is substantially performed based on an observation result of a state of vaporization of the liquid material. While a temperature of the liquid adhering surface 123*a* that is a control object varies due to vaporization heat on the liquid adhering surface 123*a*, heat stored by the heat storage plate 123 is utilized so that such a variation is gradual. For temperature control of the heat storage plate 123, temperature feedback is performed using a temperature measured in a region having a most drastic temperature variation among the liquid adhering surface 123*a*. Accordingly, control with small temperature variations and high responsiveness is realized while suppressing an amount of heat supplied by the heater 122.

In order to achieve such responsiveness, the thermocouple 195 is favorably arranged in a vicinity of the orifice 127. Such an arrangement enables monitoring of a state of vaporization at a position where the liquid material is first supplied at the start of supply of the liquid material and also enables monitoring of a state of vaporization at a position where the liquid material remains last when the supply of the liquid material ends. Such an arrangement is also advantageous in that a vaporization process can be monitored from start to finish.

However, in order to give priority to shortening a length of the orifice 127, the thermocouple 195 is favorably arranged at a position nearest to the orifice 127 while avoiding the shutoff valve 180 or, in other words, at a position adjacent to the shutoff valve 180.

In a case in which the temperature control of the heat storage plate 123 is on-off control, the shutoff valve 180 is favorably opened and closed in a state not too affected by a transient response attributable to an energization operation (energization or de-energization). Specifically, a control law or an interlock logic is applied which prevents on-off operations and energization operations of the shutoff valve 180 from overlapping each other in a preset period of time. This is because there may be cases where coinciding of a start or stop timing of supply of the liquid material with an energization operation makes it difficult to distinguish between the start or stop timing and the energization operation.

On the other hand, when temperature control of the heat storage plate 123 is proportional control, a temperature variation similar to an abrupt variation attributable to a start or stop of supply of the liquid material is unlikely to occur. Therefore, an observation of the start or stop of supply of the liquid material can be achieved with high reliability.

Furthermore, when a characteristic of variation (a temperature variation waveform) attributable to a start or stop of supply of the liquid material is known in advance, a filter may be used which is intended to extract the waveform. Specifically, for example, a configuration may be adopted in which time-series data of temperatures during a certain period of time after opening or closing the shutoff valve 180 is acquired and a peak of a waveform of a specific wavelength is detected by fast Fourier transform. Consequently, monitoring of a state of vaporization can be achieved with high accuracy.

As shown, in the second embodiment, a state of vaporization can be monitored using a temperature variation of the heat storage plate 123 attributable to vaporization heat. Accordingly, a vaporization process can be reliably monitored and, at the same time, failure detection can be achieved to improve the quality of a semiconductor process.

Compared to the supply method according to the first embodiment, the same advantageous effects achieved by the supply method according to the first embodiment can also be achieved by the second embodiment. In addition, the second embodiment also advantageously suppresses scattering of the liquid material, expands a vaporization area of the liquid material, and stabilizes (increases accuracy) the supply of the liquid material.

In regards to scattering of the liquid material, the first embodiment successfully expands a vaporization area in comparison to conventional art by using the mesh 24 to promote wetting of the liquid adhering surface 23*a* by the liquid material. On the other hand, in the second embodiment, since the liquid material is further supplied from a rear side of the mesh 124, liquid-state scattering (dispersion) of the liquid material attributable to discharged liquid material colliding with the mesh 124 can be suppressed even if the liquid material is supplied in a pressurized state. When the liquid material is supplied under pressure, leakage can be suppressed by making the mesh 124 finer using a reaction force from the pins 124*f* provided at positions opposing the supply port. Such a mechanism enables the second embodiment to further increase supply rate.

The present inventors have found that the scattering of the liquid material adversely affects a process object. Scattering of the liquid material may cause the liquid material to solidify without evaporating due to the liquid material colliding with and being scattered by the mesh 24 and adhering to an unheated discharge side (for example, in a vicinity of the nozzle 27 (refer to FIG. 2)). Solid matter created by the solidifying of the liquid material subsequently peels off and is supplied to the process target together with nitrogen gas, and may cause a degradation in quality of the process target.

In regards to an expansion of a liquid material vaporization area, since scattering of the liquid material hardly occurs in the second embodiment, a supply rate of the liquid material can be increased. Furthermore, since the liquid material flows from the orifice 127 through a gap between the mesh 124 and the liquid adhering surface 123*a* due to interfacial tension and is smoothly supplied to a wide region of the mesh 124, a vaporization area of the liquid material can be significantly expanded. Moreover, since there is hardly any risk of adhesion to a discharge side, by making the vaporization flow channel 175 thinner in a vertical direction (relative to gravity) or reducing an interval between the cover 121 and the liquid adhering surface 123*a* while expanding the vaporization area of the liquid material, thinning of the vaporizer 112 can also be achieved.

In regards to stabilizing supply of the liquid material, in the second embodiment, since the orifice 127 formed inside the heat storage plate 123 subjected to heat is directly shut off by the diaphragm valve 181 as described above, an inconvenience such as a fluctuation of a vaporization amount attributable to the liquid material remaining in the discharge passage can be avoided. Furthermore, since the diaphragm valve 181 does not have a slide portion exposed on a side of a flow channel, the creation of solid matter attributable to an accumulation of the liquid material at the sliding portion can be prevented. Consequently, by suppressing the creation of solid matter, quality degradation of a process target attributable to contamination of nitrogen gas by the solid matter can be prevented.

As described above, by supplying the liquid material between the mesh 124 and the liquid adhering surface 123*a*, the vaporizer 112 according to the second embodiment effectively utilizes interfacial tension while suppressing scattering of the liquid material to achieve a high supply rate of the liquid material. In addition, since the shutoff valve 180 is mounted in a mode in which the shutoff valve 180 is integrated with a depression formed on the heat storage plate 123, a thickness of the vaporizer 112 can be reduced while maintaining a heat storing volume of the heat storage plate 123.

(Other Embodiments)

The present invention is not limited to the embodiments described above and may instead be implemented as follows.

(1) While liquid material is spread in a thin film using the meshes 24 and 124 in the embodiments described above, the liquid material may be spread in a thin film using other means. For example, two liquid adhering surfaces that oppose each other may be arranged with a predetermined gap therebetween, wherein a liquid material is injected into the gap in order to spread the liquid material in a thin film utilizing capillary action. Hereinafter, a specific example thereof will be described with reference to FIG. 18.

Figure 18:
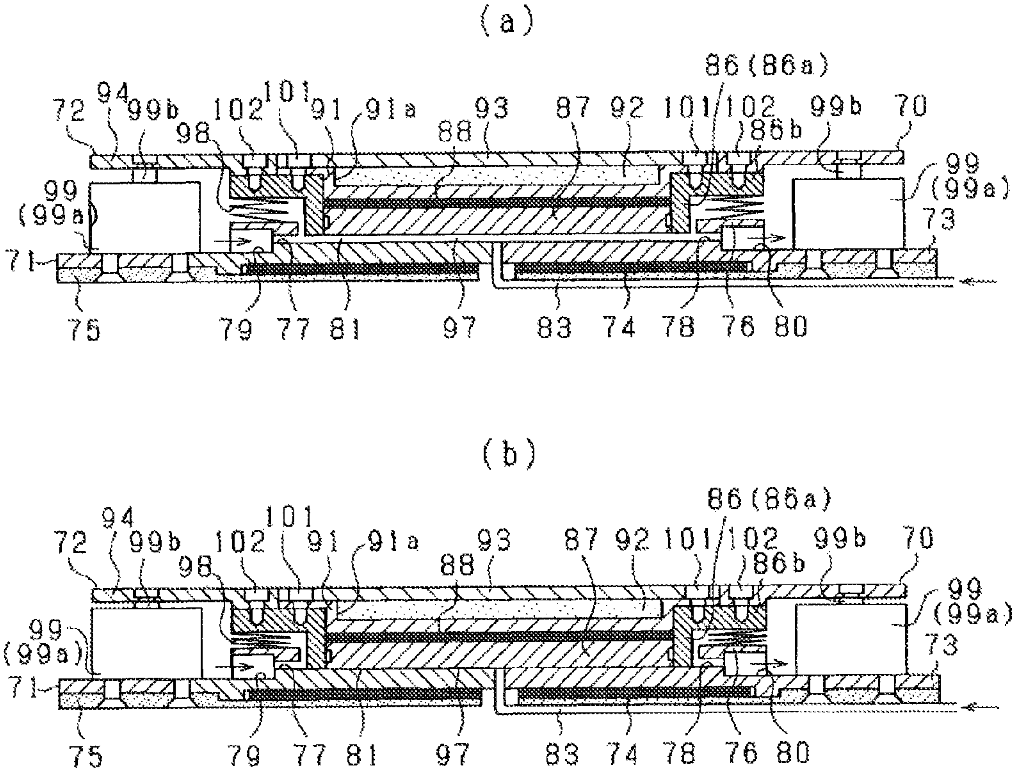
FIG. 18 is a longitudinal sectional view showing a configuration of a vaporizer according to another example.

In the present example, a configuration is adopted in which a vaporizer 70 shown in FIG. 18 is provided in a liquid vaporization system instead of the vaporizer 12 according to the embodiments described above. The vaporizer 70 according to the present example has a fixed portion 71 that constitutes a base of the vaporizer 70 and a movable portion 72 which is provided above the fixed portion 71 and which is vertically movable.

The fixed portion 71 has a base portion 73 formed into a disk shape, a lower heater 74 as heating means, and a heat insulating material 75. The base portion 73 is formed by, for example, aluminum which has superior thermal conductivity and is provided in an approximately horizontal state. A projecting portion 76 that projects upward is provided on the base portion 73. The projecting portion 76 is formed in an overall annular shape, and an inner region enclosed by the projecting portion 76 constitutes an arrangement space 81 in which a part of the movable portion 72 is arranged. Formed on the projecting portion 76 are an inlet port 79 that is communicated with the arrangement space 81 via an inlet passage 77 and a discharge port 80 that is communicated with the arrangement space 81 via a discharge passage 78. An inlet pipe (not shown) that leads to a nitrogen gas source is connected to the inlet port 79, and a discharge pipe (not shown) that leads to a chamber is connected to the discharge port 80.

In addition, a supply pipe 83 for supplying the liquid material is provided on the base portion 73 so as to vertically penetrate the base portion 73. The supply pipe 83 leads to the arrangement space 81 at an approximately central position of the arrangement space 81 in a plan view.

The lower heater 74 is, for example, a sheet-like rubber heater formed into a disk shape with a diameter that is larger than an outer diameter of the arrangement space 81 (in other words, an inner diameter of the projecting portion 76). The lower heater 74 overlaps a lower surface of the base portion 73. Specifically, the lower heater 74 is provided so as to overlap the entire arrangement space 81 in plan view.

The heat insulating material 75 is made of glass wool formed in a disk shape. The heat insulating material 75 is provided so as to spread across the entire base portion 73 under the base portion 73 and the lower heater 74.

On the other hand, the movable portion 72 has a housing member 86, and a heat storage plate 87 and an upper heater 88 housed in the housing member 86. The housing member 86 has a cylindrical housing portion 86*a* opened at top and bottom thereof, and a flange portion 86*b* provided at an upper end of the housing portion 86*a*. The heat storage plate 87 is formed by the same material as the base portion 73 and is a disk having an outer diameter that is approximately the same as an inner diameter of the housing portion 86*a* of the housing member 86. The heat storage plate 87 is arranged at a lower end of the housing member 86 on an inside of the housing portion 86*a*, and a side surface of the heat storage plate 87 opposes an inner surface of the housing portion 86*a*. Specifically, the heat storage plate 87 is set so that a height of a lower surface thereof is approximately the same or lower than a height of the lower end of the housing portion 86*a*.

In a similar manner to the lower heater 74, the upper heater 88 is, for example, a sheet-like rubber heater formed into a disk shape with an external size that is approximately the same as that of the heat storage plate 87. The upper heater 88 is arranged inside the housing portion 86*a* of the housing member 86 and overlaps the upper surface of the heat storage plate 87.

A lid portion 91 having a depression 91*a* opened upward is provided above the upper heater 88, and a heat insulating material 92 is arranged in the depression 91*a*. A plate-shaped cover 93 is provided on the heat insulating material 92 and is fixed to the flange portion 86*b* of the housing member 86 by a bolt 101. In addition, a plate member 94 with a flat plate shape is provided on an upper surface of the flange portion 86*b* of the housing member 86 so as to protrude sideways from the flange portion 86*b*. A plurality of (for example, four) plate members 94 are provided at predetermined intervals along an outer circumferential direction of the flange portion 86*b*, and each plate member 94 is fixed to the flange portion 86*b* by a bolt 102.

The movable portion 72 configured as described above is arranged on the fixed portion 71 in a state in which a part of the movable portion 72 is lowered into the arrangement space 81. Specifically, in this arrangement state, the lower surface of the heat storage plate 87 opposes the upper surface of the base portion 73 with a predetermined gap therebetween, wherein the gap (more specifically, also including a gap between the housing portion 86*a* of the housing member 86 and the projecting portion 76 of the base portion 73) constitutes a vaporization chamber 97 for vaporizing the liquid material.

The flange portion 86*b* of the housing member 86 is arranged on the projecting portion 76 of the base portion 73, and a bellows 98 that bridges the flange portion 86*b* and the projecting portion 76 is provided between both portions 76 and 86*b*. The bellows 98 is a partition member for dividing an inside and an outside of the vaporization chamber 97 from each other and is configured so as to be vertically expandable.

The supply pipe 83 leads to the vaporization chamber 97. The liquid material is supplied to the vaporization chamber 97 via the supply pipe 83. In addition, the vaporization chamber 97 communicates with the inlet port 79 via the inlet passage 77 and communicates with the discharge port 80 via the discharge passage 78. Nitrogen gas is supplied to the vaporization chamber 97 via the inlet port 79, and the supplied nitrogen gas and vaporized liquid material are supplied to the chamber via the discharge port 80.

A pneumatic cylinder-type lifting and lowering device 99 that vertically moves the movable portion 72 is provided below the respective plate members 94. The lifting and lowering device 99 has a cylinder main body portion 99*a* fixed onto the base portion 73 of the fixed portion 71 and a piston rod 99*b* that rises and falls when operating air is introduced into the cylinder main body portion 99*a*. Each plate member 94 is fixed to an upper surface of the piston rod 99*b* by a bolt. Consequently, when the piston rod 99*b* moves vertically, each plate member 94 moves vertically and, in turn, the movable portion 72 moves vertically. Specifically, the movable portion 72 is arranged so as to be movable between a low position (refer to FIG. 18(*b*)) at which a lower surface of the heat storage plate 87 approaches an upper surface of the base portion 73 and a high position (refer to FIG. 18(*a*)) that is above the lower position. In the present embodiment, when the movable portion 72 is at the low position, a gap of 20 to 60 μm exists between the lower surface of the heat storage plate 87 and the upper surface of the base portion 73, and when the movable portion 72 is at the high position, there is a gap of 2 mm between the lower surface of the heat storage plate 87 and the upper surface of the base portion 73.

Next, an operation when vaporizing the liquid material with the vaporizer 70 having the above configuration will be described. In the present example, it is assumed that a liquid material is used which has a contact angle greater than 90° with the liquid adhering surface (specifically, the base portion 73 and a plate surface of the heat storage plate 87).

First, as shown in FIG. 18(*b*), the lifting and lowering device 99 is driven to move the movable portion 72 to the low position. A discharge operation of the pump is then performed to supply the liquid material to the vaporization chamber 97 via the supply pipe 83. In this case, in the vaporization chamber 97, due to a capillary action, the liquid material spreads through the gap between the lower surface of the heat storage plate 87 and the upper surface of the base portion 73 in a thin film toward a separating side of a supply port (not shown) of the supply pipe 83. In addition, in plan view, the liquid material spreads in a circular pattern centered around the supply port of the supply pipe 83.

Next, the lifting and lowering device 99 is driven to move the movable portion 72 to the high position. In this case, the liquid material spread in a thin film is adhered to the lower surface of the heat storage plate 87 and the upper surface of the base portion 73, and the liquid material adhered to the respective surfaces is heated and vaporized by the heaters 74 and 88 via the respective surfaces. In addition, after moving the movable portion 72 to the high position, nitrogen gas is introduced into the vaporization chamber 97 from the inlet port 79. As a result, the vaporized liquid material is supplied together with the nitrogen gas introduced into the vaporization chamber 97 to the chamber via the discharge port 80.

According to the configuration described above, since the liquid material can be spread through the gap between the lower surface of the heat storage plate 87 and the upper surface of the base portion 73 in a thin film due to a capillary action, the liquid material can be adhered to the lower surface of the heat storage plate 87 and the upper surface of the base portion 73 in a thin film. In addition, since the liquid material adhered to the respective surfaces can be heated by the heaters 74 and 88 via the respective surfaces or, in other words, since the liquid material can be heated via two liquid adhering surfaces, vaporization of the liquid material can be further promoted.

(2) While configurations are adopted in the embodiments described above in which an irregular section is provided on a liquid adhering surface using the meshes 24 and 124, a configuration for providing an irregular section is not limited thereto. For example, an irregular section may be provided by irregularly processing a surface of the liquid adhering surface without using the mesh 24. In this case, since a separate member for forming an irregular section need not be provided, the number of parts can be reduced.

(3) While protrusions 52 and depressions 53 are alternately arranged on the heat storage plate 23 along two directions which are perpendicular to each other and which are parallel to the upper surface 23*a* of the heat storage plate 23 in the embodiments described above, the two directions need not be perpendicular to each other and need only be different from each other. In addition, a configuration may be adopted in which the protrusions 52 and depressions 53 are arranged only along a single direction which is parallel to the upper surface 23*a* of the heat storage plate 23.

(4) While stainless-steel meshes 24 and 124 are used in the embodiments described above, the mesh need not necessarily be made of stainless steel and meshes made from other metals may be used. In addition, a resin mesh made of fluororesin or the like may be used. Furthermore, while a mesh having a roughness of 100 mesh is used as the mesh 24 in the embodiments described above, a mesh having a different roughness may be used. What matters is using a mesh having a roughness appropriate for the type (more specifically, the wettability) of the liquid material to be vaporized.

(5) While a configuration in which the liquid material is supplied to the vaporizer 12 by a pump 11 is adopted in the embodiments described above, the liquid material may be supplied to the vaporizer 12 by means other than the pump 11. For example, the liquid material may conceivably be supplied under pressure to the vaporizer 12 by sealing a liquid tank and connecting a pipe to the liquid tank, and pressurizing the interior of the liquid tank via the pipe.

(6) While a configuration is adopted in the embodiments described above in which the liquid material is spread in a thin film by enhancing the wettability of the liquid material, the liquid material may be spread in a thin film using other means. For example, a configuration is conceivable which has a pair of flat plate members separated from and opposing each other, and a drive apparatus that moves at least one of the plate members in a direction perpendicular to a plate surface of the plate member. In this case, by supplying the liquid material between both plate members and driving the drive apparatus to bring one of the plate members closer to the other plate member, the liquid material can be compressed by both plate members. As a result, the liquid material can be spread in a thin film between both plate members.

(7) While the present liquid vaporization system 10 is used in a semiconductor production line in the embodiments described above, the present liquid vaporization system 10 can also be used in other production lines. In addition, while the present system 10 is used to vaporize a hexamethyldisilazane solution (HMDS solution) as the liquid material in the embodiments described above, the present system 10 may also be used to vaporize other liquid material such as tetramethyl cyclotetrasiloxane (TMCTS).

(8) While the liquid adhering surface 123*a* has a planar shape in the embodiments described above, the liquid adhering surface 123*a* need not necessarily have a planar shape. Specifically, for example, the liquid adhering surface 123*a* may have a gradual concave shape centered around the orifice 127 or a gradual convex shape centered around the orifice 127.

(9) While the liquid adhering surface 123*a* does not have a groove portion or a partial projecting portion in the embodiments described above, for example, a groove (bypass channel) or a protrusion (detour element) may be formed for controlling a flow of the liquid material between the mesh 124 and the liquid adhering surface 123*a*. The groove may have, for example, a radial pattern extending from the orifice 127.

(10) While a single liquid material supply port (outlet of the nozzle 27 or the orifice 127) is provided in the embodiments described above, supply ports need not necessarily be singularly provided and a plurality of supply ports may be formed. However, providing only a single supply port enables reduction of an amount of the liquid material remaining in the supply port when closing the shutoff valve.

(11) While the mesh 124 is pressed against the liquid adhering surface 123*a* by a plurality of pins 124*f* in the embodiments described above, a positioning member may be used which presses the mesh 124 against the liquid adhering surface 123*a* using a net or a string fixed to an edge of the liquid adhering surface. The positioning member may also be configured so as to include, for example, a spacer that is partially inserted to form a gap between the liquid adhering surface and the mesh. Even with such a configuration, problems can be avoided such as the filling of gaps of the mesh by an adhesive or the like when such an adhesive is used to attach the mesh, or the creation of solid matter due to aggregation of the liquid material in a vicinity of a fastened portion when a fastening member is used to fasten the mesh.

(12) While a discharge amount is adjusted by checking angles of rotation of the stroke limiting member 157L and the stroke limiting member 157R by graduations (not shown) in the embodiments described above, for example, the discharge amount may be adjusted by activating the pump 111 together with the suction valve 113 and the discharge valve 114 and monitoring a discharge amount and by confirming that a preset discharge amount is reached. The discharge amount can be confirmed in a single or a plurality of activation states (activation modes) assumed for practical use including a case in which both the first valve unit main body 131L and the second valve unit 111R are activated or discharge occurs from only one.

Figure 19:
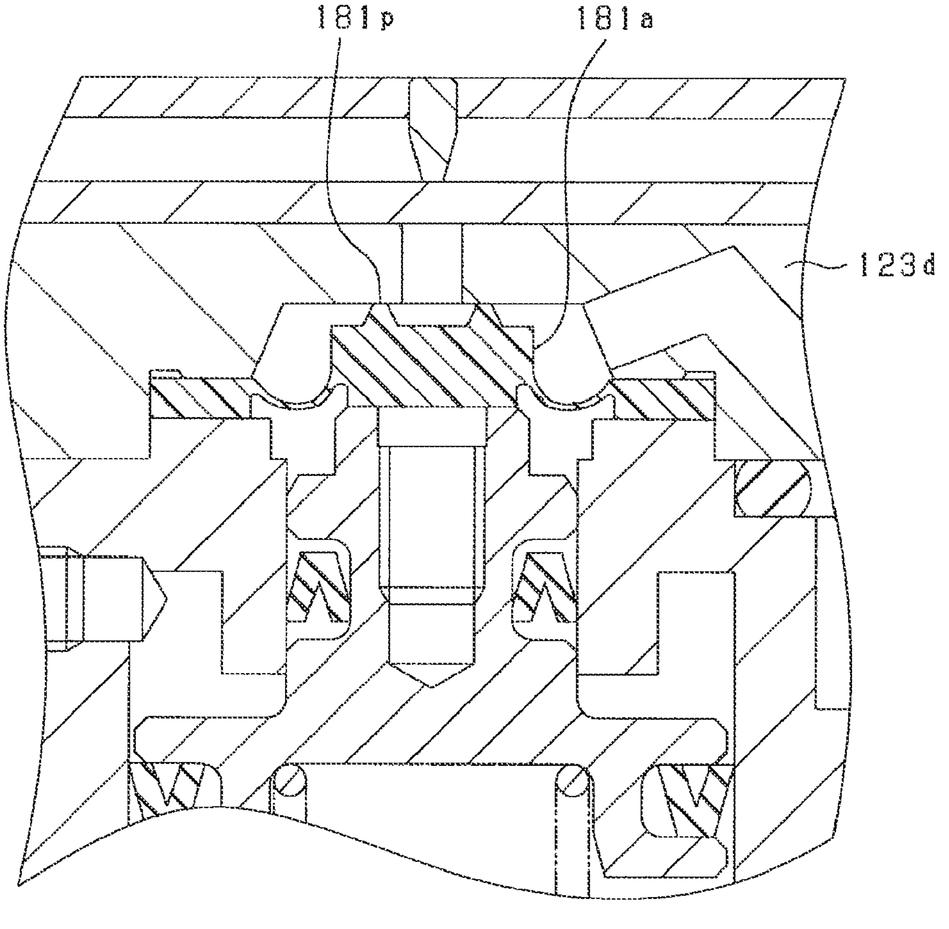
FIG. 19 is an enlarged sectional view showing a state in which an orifice is closed by a shutoff valve according to the other example.

(13) While the shutoff valve 180 is formed in a depression in which the valve seat 181*v* (refer to FIG. 16) forms a flow channel chamber 181*r* in the embodiments described above, other configurations can also be adopted. Specifically, as shown in FIG. 19, for example, a configuration may be adopted in which the valve seat 181*v* is not formed on a side of a heat storage plate 123*d* and an annular projecting portion 181*p* that encloses the rear surface opening is formed on a side of the diaphragm valve 181*a*. The annular projecting portion 181*p* is also referred to as a sealing portion. Consequently, retention of bubbles around the valve seat 181*v* formed on the rear surface opening can be prevented. This is because such retention occurs due to the valve seat 181*v* bulging downward relative to gravity.

A configuration may be adopted in which the projecting portion 181*p* of the diaphragm valve 181*a* has a height of approximately 0.5 mm. The rear surface opening is an inlet of the orifice 127 on a side of the shutoff valve 180. When the annular projecting portion 181*p* is provided on the side of the diaphragm valve 181*a* as shown in FIG. 19, the rear surface opening may be provided with a slope that rises in a direction of gravity toward the projecting portion 181*p*. Such an arrangement enables bubbles to rise along the slope and further suppresses the retention of bubbles.

Figure 20:
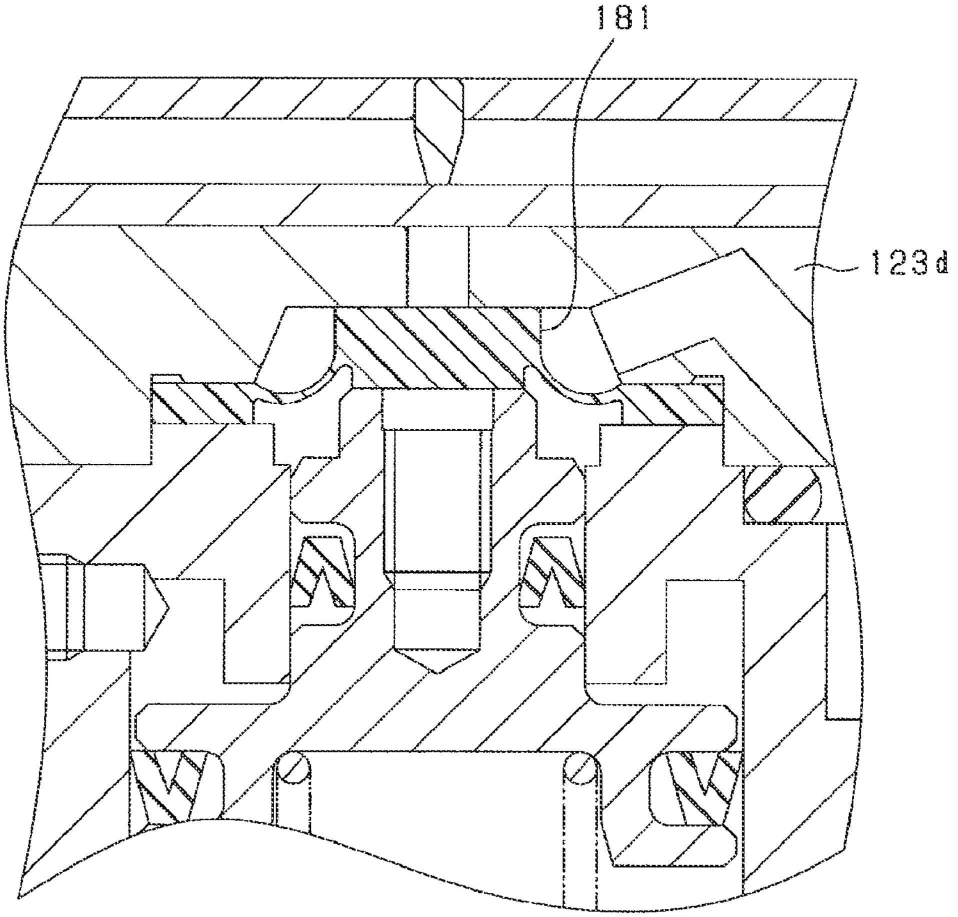
FIG. 20 is an enlarged sectional view showing a state in which an orifice is closed by a shutoff valve according to yet another example.

Furthermore, a configuration may be adopted in which the valve seat and the sealing portion are omitted as shown in FIG. 20. Specifically, instead of a configuration in which surface pressure is increased by providing a valve seat or a projecting portion, a flat surface opposing the valve element may be provided instead. In other words, a flat surface opposing the valve element may be formed in an annular region of the depression surrounding the rear surface opening. This is because back pressure is not applied during shutoff in the present embodiment. However, favorably, a surface roughness of the annular region surrounding the rear surface opening is lowered in order to enhance a sealing property.

DESCRIPTION OF SYMBOLS

10 Liquid vaporization system
11, 111 pump
12, 112 vaporizer
16 discharge passage as a supply passage
20, 120 liquid vaporization apparatus
22, 122 heater as heating means
23, 123 heat storage plate
23*a*, 123*a* upper surface of heat storage plate as a liquid adhering surface
24, 124 mesh as thin-film forming means and wetting promoting means
24*a* wire
40 controller as control means
52 protrusion
53 depression

The invention claimed is:

1. A liquid vaporization system comprising a vaporizer that is configured to apply heat to vaporize a liquid material, wherein
the vaporizer includes:
a liquid adhering surface which is formed flat and to which the liquid material is adhered;
thin-film forming means that is configured to form the liquid material adhered to the liquid adhering surface into a thin film; and
heating means that is configured to heat the liquid adhering surface, and
wherein
the thin-film forming means is wetting promoting means that is configured to promote wetting of the liquid adhering surface by the liquid material, and the liquid material adhered to the liquid adhering surface is formed into a thin film by promoting the wetting of the liquid adhering surface by the liquid material,
the wetting promoting means is a minute irregular section provided on the liquid adhering surface to enhance wettability of the liquid adhering surface by the liquid material,
the liquid adhering surface is mounted with a mesh formed by interweaving wires in an overall flat plate shape and is provided with the irregular section in which the wires constitute protrusions and portions surrounded by the wires constitute depressions,
a supply port that is configured to supply the liquid material between the liquid adhering surface and the mesh is formed on the liquid adhering surface.

2. The liquid vaporization system according to claim 1, comprising a positioning member that determines a relative positional relationship between the liquid adhering surface and the mesh in a stacking direction.

3. The liquid vaporization system according to claim 2, wherein the positioning member comprises pressing members that are configured to press the mesh against the liquid adhering surface at a plurality of positions arranged at a predetermined interval.

4. The liquid vaporization system according to claim 1, wherein
the liquid adhering surface is a surface of a heating plate that is heated by the heating means,
the heating plate is formed with an orifice that connects the supply port with a rear surface opening formed on a rear surface that is opposite to the liquid adhering surface, the rear surface opening that is opened and closed by a shutoff valve, and
the rear surface opening is formed at a position opposing the supply port across the orifice.

5. The liquid vaporization system according to claim 4, wherein
a depression is formed on a rear surface of the heating plate,
the rear surface opening is formed in the depression, and
the shutoff valve has a valve element that is configured to close the rear surface opening.

6. The liquid vaporization system according to claim 5, wherein the valve element has a sealing portion that is an annular projecting portion that surrounds the rear surface opening in a state in which the rear surface opening is closed.

7. The liquid vaporization system according to claim 5, wherein the rear surface opening has a valve seat formed in the depression.

8. The liquid vaporization system according to claim 5, wherein the rear surface opening has a flat surface that opposes the valve element in an annular region surrounding the rear surface opening.

9. The liquid vaporization system according to claim 5, wherein the valve element has a diaphragm that is configured to open and close the rear surface opening.

10. The liquid vaporization system according to claim 1, wherein
the liquid adhering surface is formed as a surface of a heating plate that is heated by the heating means, and
the heating plate is provided with a temperature sensor that is configured to measure a temperature of the liquid adhering surface.

11. The liquid vaporization system according to claim 1, further comprising a pump that is configured to supply the liquid material to the vaporizer, wherein
the pump includes a first diaphragm driving unit, a second diaphragm driving unit, and a joining section that joins the first diaphragm driving unit and the second diaphragm driving unit in a direction in which the first diaphragm driving unit and the second diaphragm driving unit oppose each other, the joining section has a pump chamber to which a suction passage that is configured to suction the liquid material and a discharge passage that is configured to discharge the liquid material are connected, the first diaphragm driving unit has a first diaphragm that constitutes a part of the pump chamber, the second diaphragm driving unit has a second diaphragm that constitutes a part of the pump chamber, the first diaphragm and the second diaphragm form surfaces that oppose each other in the pump chamber, the first diaphragm driving unit has a first displacement limiting unit that limits a first displacement by which the first diaphragm is mechanically displaceable and that enables adjustment of the first displacement, and the second diaphragm driving unit has a second displacement limiting unit that limits a second displacement by which the second diaphragm is mechanically displaceable and that enables adjustment of the second displacement.

12. The liquid vaporization system according to claim 11, wherein the first displacement limiting unit is configured to adjust the first displacement by performing a first rotation relative to the pump with a displacement direction of the first diaphragm as an axis, the second displacement limiting unit is configured to adjust the second displacement by performing a second rotation relative to the pump with a displacement direction of the second diaphragm as an axis, and the pump is provided with a measuring unit that is configured to indicate a value related to a discharge amount measured in accordance with an angle of the first rotation and an angle of the second rotation.

13. The liquid vaporization system according to claim 1, wherein the irregular section comprises a large number of depressions and a large number of protrusions, and the respective depressions and the respective protrusions are alternately arranged along two different directions that are both parallel to the liquid adhering surface.

14. The liquid vaporization system according to claim 1 wherein the vaporizer has a pair of the liquid adhering surfaces opposing each other with a predetermined gap therebetween, and the wetting promoting means promotes wetting of the respective liquid adhering surfaces by the liquid material in the gap by capillary action.

15. The liquid vaporization system according to claim 1, comprising a pump that is configured to supply the liquid material to the vaporizer via a supply passage, and supply adjusting means that is configured to adjust a supply of the liquid material to the vaporizer by the pump.

16. The liquid vaporization system according to claim 15, comprising suck back control means that is configured to control the pump to suction the liquid material remaining in the supply passage after the pump supplies the liquid material to the vaporizer via the supply passage.

17. The liquid vaporization system according to claim 15, comprising a unitized liquid vaporization apparatus including the pump, the vaporizer, and the supply passage.

* * * * *